(12) United States Patent
Ishihara et al.

(10) Patent No.: US 6,864,638 B2
(45) Date of Patent: Mar. 8, 2005

(54) ORGANIC LIGHT-EMITTING DISPLAY DEVICE

(75) Inventors: Shingo Ishihara, Mobara (JP); Takayuki Ouchi, Hitachi (JP); Toshiro Mikami, Hitachiohta (JP); Kazuhito Masuda, Hitachi (JP); Sukekazu Aratani, Hitachiohta (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/331,684

(22) Filed: Dec. 31, 2002

(65) Prior Publication Data

US 2003/0146693 A1 Aug. 7, 2003

(30) Foreign Application Priority Data

Feb. 6, 2002 (JP) .......................................... 2002-029894
Sep. 20, 2002 (JP) .......................................... 2002-274254

(51) Int. Cl.[7] ................................................ G09G 3/10
(52) U.S. Cl. ................................ 315/169.3; 315/169.1; 257/59; 313/506
(58) Field of Search ........................... 315/169.1, 169.3, 315/169.4; 345/76, 80; 313/504, 505, 506; 257/40, 59, 72, 350

(56) References Cited

U.S. PATENT DOCUMENTS

| | | | | |
|---|---|---|---|---|
| 6,147,451 A | * | 11/2000 | Shibata et al. | 313/506 |
| 6,356,032 B1 | * | 3/2002 | Suzuki et al. | 315/169.3 |
| 6,538,390 B2 | * | 3/2003 | Fujita et al. | 315/169.3 |
| 6,573,651 B2 | * | 6/2003 | Adachi et al. | 313/504 |

* cited by examiner

Primary Examiner—Don Wong
Assistant Examiner—Jimmy Vu
(74) Attorney, Agent, or Firm—Antonelli, Terry, Stout & Kraus, LLP

(57) ABSTRACT

A scanning line, signal line, first current supply line, and second current supply line are formed on a glass substrate. A first electrode is formed thereon; and, an organic layer, including a hole transport layer, light-emitting layer, electron transport layer, and electron injection layer is formed on the first electrode. A second electrode is formed as a cathode on the electron injection layer. The first electrode, serving as an anode, is connected to a plus terminal of a power source through driving devices and first current supply line, whereas the second electrode is connected to a minus terminal of the power source and is connected to the second current supply line in the display region of each pixel, with a contact hole serving as a feeding point, whereby the wiring resistance of the second electrode is reduced, and variations in the brightness of the panel is reduced.

16 Claims, 25 Drawing Sheets

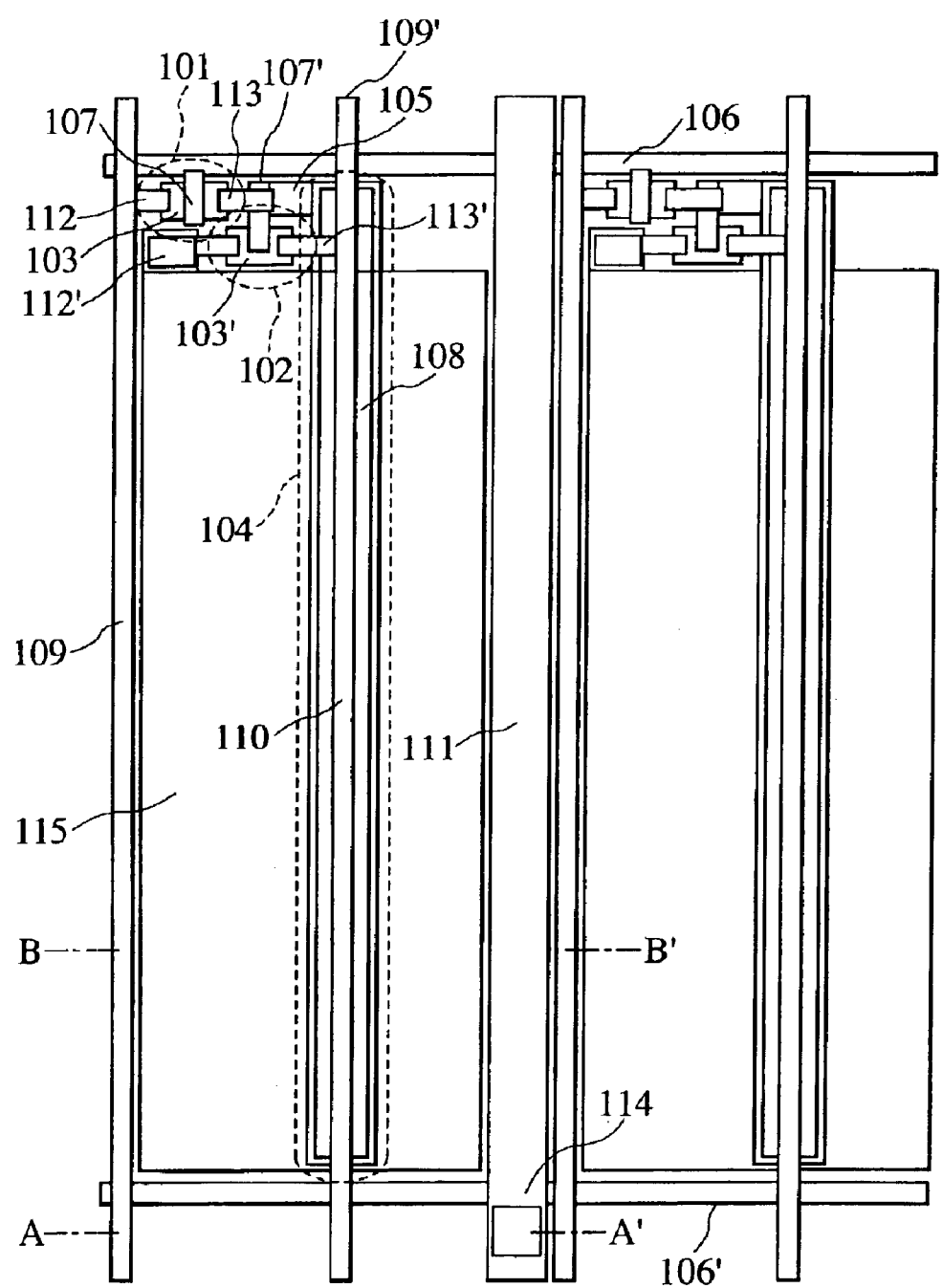

ORGANIC LIGHT-EMITTING DISPLAY DEVICE

BACKGROUND OF THE INVENTION

The present invention relates in general to an organic light-emitting display device; and, more particularly, the invention relates to a display device that is preferable for use in displaying pictures by means of organic light-emitting devices.

Planar type display devices of the type used as man-machine interfaces have received increased attention with the advent of the real multi-media age. Such planar type display devices have used liquid crystal displays; however, liquid crystal display devices have problems in that they have a narrow angle of visibility and low-speed response characteristics.

In recent years, organic light-emitting display devices have been proposed as the next-generation planar type display device. In this regard, organic light-emitting display devices have such characteristics as excellent auto-light-emission, a wide angle of visibility, and a high-speed response.

In such organic light-emitting display devices, pixels are formed by organic light-emitting elements, and the organic light-emitting display device has a structure in which a first electrode, such as ITO, an organic layer comprised of a hole transport layer, a light-emitting layer, an electron transport layer, etc., and a second electrode having a small work function, are provided on a glass substrate.

When a voltage of several volts is applied between the electrodes, holes are injected into the first electrode, whereas electrons are injected into the second electrode, and the holes and electrons pass, respectively, through the hole transport layer or the electron transport layer so as to be coupled with each other in the light-emitting layer, whereby excitons are generated. Light is emitted when the exciton returns to its ground state. The light thus emitted is transmitted through the first electrode, which is being transparent, and is taken out from the back side of the substrate.

The types of display systems using organic light-emitting elements for pixels include simple matrix organic light-emitting display devices and active matrix organic light-emitting display devices.

The simple matrix organic light-emitting display device comprises an organic layer comprised of a hole transport layer, a light-emitting layer, an electron transport layer, etc. provided at positions of intersection of pluralities of anode lines and cathode lines, and each pixel is turned ON for a selected time during one frame period. The selected time is a time width obtained by dividing one frame period by the number of the anode lines. The simple matrix organic light-emitting display device has the advantage of having a simple structure.

However, the selected time is shortened as the number of the pixels increases, so that it is necessary to raise the driving voltage to thereby enhance the instantaneous luminance during the selected time and to bring the average luminance during one frame period to a predetermined value. Thus, there is the problem that the life of the organic light-emitting devices is shortened. In addition, since the organic light-emitting devices are driven by an electric current, the voltage drop due to the wiring resistance is generated, and the voltage cannot be uniformly impressed on each of the pixels, particularly in the case of a large screen, with the result that variations in brightness are produced in the display device. Thus, the simple matrix organic light-emitting display device has limitations as to enhancement of the definition and enlargement of the screen.

On the other hand, in the active matrix organic light-emitting display device, a driving device made up of a switching device composed of two to four thin film transistors and a capacitance is connected to an organic EL (light-emitting) device constituting each pixel, and so full turning-ON during one frame period is possible. Therefore, it is unnecessary to enhance the brightness, and it is possible to prolong the life of the organic light-emitting devices. Accordingly, the active matrix organic light-emitting display device is advantageous from the viewpoint of enhancement of the definition and enlargement of the screen.

In the conventional organic light-emitting display devices, the light being emitted is taken out from the back side of the substrate, and therefore, an aperture ratio is limited in the active matrix organic light-emitting display device in which a driving portion is provided between the substrate and the organic light-emitting device.

In order to solve the above-mentioned problems, attempts are provided to make the upper second electrode transparent and to take out the emitted light from the upper electrode side.

For example, U.S. Pat. No. 5,703,436 discloses an organic EL device in which the upper electrode is constituted of two layers, in which an injection layer of Mg, Ag, etc. is used as a first layer, a transparent electrode of ITO (Indium Tin Oxide), etc. is used as a second layer, and light is taken out from the upper electrode.

In addition, Japanese Patent Laid-open No 6-163158 (1994) discloses an organic EL device comprising an electron injection layer composed of a transparent alkaline earth metal oxide and a transparent cathode material.

Besides, Japanese Patent Laid-open No. 2001-148291 discloses a pixel structure in which a partition wall is formed at an upper portion at the position where an electrode of a driving device and a lower electrode of an organic light-emitting device constituting a pixel are connected in an active matrix organic light-emitting display device. It is also disclosed that this structure is applicable also to a display device in which light is taken out from the upper electrode side.

In the device mentioned above, a transparent conductive film is used as the second electrode to take out light from the upper electrode side. In this case, film formation at a low temperature is indispensable in order not to cause damage to the organic layer functioning as an underlying layer. As a result, the resistance of the film is as high as not less than 300 times in resistivity as compared with a metallic film of Al or the like. In addition, even in the case where the second electrode is constituted of a metallic film, in order to reduce the damage to the organic layer functioning as the underlying layer, it is impossible to enlarge the thickness of the metallic film. Therefore, enlargement of the size of the panel poses a problem with the high resistance of the electrode.

Besides, in the conventional active matrix organic light-emitting display device, current supply lines for connecting the first electrode (anode) and the second electrode (cathode) on the opposite sides of the organic layer of the organic light-emitting device with a power source are formed by use of a metallic film of a driving layer. In this case, the connection between the current supply line connected to a minus terminal of the power source and the second electrode (cathode) of the organic light-emitting device is established through a contact hole formed in an inter-layer insulation film provided in a region free of pixels, for example, in the vicinity of a panel edge.

In other words, the second electrode of the organic light-emitting device belonging to each pixel and the current supply line are connected to each other through the contact hole. In this case, since the contact hole serves as a feeding point and the feeding point and the second electrode of each organic light-emitting device are connected by the current supply line, the resistance of wiring the varies with the distance from the contact hole to the pixel. Therefore, the effective voltage applied to the organic light-emitting device constituting the pixel varies with the wiring resistance, and the luminance value varies according to the position of the pixel.

SUMMARY OF THE INVENTION

Accordingly, it is an object of the present invention to provide an organic light-emitting display device in which variations in brightness due to the resistance of wiring connected to an electrode of an organic light-emitting device can be reduced, as well as a method of manufacturing the organic light-emitting display device.

It is another object of the present invention to provide an organic light-emitting display device in which the deterioration of image quality due to the resistance of the wiring can be reduced, as well as a method of manufacturing the organic light-emitting display device.

In accordance with one aspect of the present invention, there is provided an organic light-emitting display device comprising a plurality of pixels, each of which is a minimum unit of a picture, and a plurality of organic light-emitting devices respectively serving as each pixel, wherein at least an electrode on one side of one organic light-emitting device belonging to each pixel, of a pair of electrodes disposed on the opposite sides of an organic layer of the plurality of organic light-emitting devices, is connected to a current supply line in a display region of each pixel.

In constructing the organic light-emitting display device, an electrode on one side of the pair of electrodes disposed on the opposite sides of the organic layer of the plurality of organic light-emitting devices may be connected to the current supply line in the display region of each pixel, and a color picture may be formed by use of light-emitting devices which emit different colors as the plurality of light-emitting devices.

In addition, in the case of forming a color image by use of a plurality of organic light-emitting devices which emit different colors, an electrode on one side of the organic light-emitting device of a specified emitted color of each pixel, of the pair of electrodes disposed on the opposite sides of the organic layer of the plurality of organic light-emitting devices, may be connected to the current supply line in the display region of each pixel.

Furthermore, at least one current supply line may be provided in a display region containing each pixel, and at least an electrode on one side of one organic light-emitting device belonging to each pixel, of the pair of electrodes disposed on the opposite sides of the organic layer of the plurality of organic light-emitting devices, may be connected to the current supply line in the display region of each pixel.

In constructing each of the organic light-emitting display devices as mentioned above, the following features (1) to (11) may be added.

(1) A driving layer comprising driving devices for driving the organic layer is stacked on a substrate, a wiring layer comprising signal lines and scanning lines connected to the driving devices is stacked, the organic layer of the plurality of organic light-emitting devices is stacked on the wiring layer on a pixel basis together with the pair of electrodes disposed on the opposite sides of the organic layer, and the current supply line is disposed in the wiring layer and connected to the electrode on one side through an inter-layer insulation film.

(2) A driving layer, including driving devices for driving the organic layer, is stacked on a substrate, a wiring layer comprising signal lines and scanning lines connected to the driving devices is stacked, the organic layer of the plurality of organic light-emitting devices is stacked on the wiring layer on a pixel basis together with the pair of electrodes disposed on the opposite sides of the organic layer, and the current supply line is disposed between the wiring layer and the organic layer and is connected to the electrode on one side through an interlayer insulation film.

(3) The electrode on one side, of the pair of electrodes disposed on the opposite sides of the organic layer of the plurality of organic light-emitting devices, is formed at an upper portion of the organic layer on the substrate as second electrodes, relative to a first electrode formed at a lower portion of the organic layer on the substrate, and the current supply line are connected to an upper portion of the second electrode.

(4) A driving layer, including driving devices for driving the organic layer, is stacked on a substrate, a wiring layer comprising signal lines and scanning lines connected to the driving devices is stacked, the organic layer of the plurality of organic light-emitting devices is laminated on the wiring layer on a pixel basis together with the pair of electrodes disposed on the opposite sides of the organic layer, the electrode on one side of the pair of electrodes disposed on the opposite sides of the organic layer of the plurality of organic light-emitting devices are formed at an upper portion of the organic layer on the substrate as a second electrode, against a first electrode formed at a lower portion of the organic layer on the substrate, and the current supply line is formed at an upper portion of the second electrode.

(5) The current supply line is formed as a mesh along each pixel.

(6) The current supply line is divided into a plurality of current supply lines in correspondence with each organic light-emitting device of each pixel, and the plurality of current supply lines thus divided are connected to each organic light-emitting device of each pixel as exclusive-use current supply lines, respectively.

(7) The current supply line is formed along each space between the pixels.

(8) The current supply line is formed to overlap each pixel.

(9) The organic light-emitting devices of a specified emitted color are composed of a material having a higher efficiency or a longer life as compared with the materials for the organic light-emitting devices of other emitted colors.

(10) The electrode on one side, of the pair of electrodes disposed on the opposite sides of the organic layer of the plurality of organic light-emitting devices, is formed at an upper portion of the organic layer on a substrate as a second electrode, relative to a first electrode formed at a lower portion of the organic layer on the substrate, the first electrode is connected to a plus terminal of a power source to serve as an anode, and the second electrode is connected to a minus terminal of the power source to serve as a cathode.

(11) The second electrodes are composed of a transparent material which transmits light therethrough.

In accordance with another aspect of the present invention, there is provided a method of manufacturing an organic light-emitting display device, particularly for manufacturing one of the above-mentioned organic light-emitting display devices, which comprises the steps of: forming an organic layer comprising a plurality of organic light-emitting devices on a substrate, forming a driving layer comprising driving devices for driving the plurality of organic light-emitting devices, forming a wiring layer comprising signal lines and scanning lines connected to the driving devices, forming current supply lines on the upper side of the organic layer or on the lower side of the organic layer, forming contact holes in an interlayer insulation film provided in the surroundings of the current supply lines, and connecting the electrodes on one side of pairs of electrodes disposed on the opposite sides of the organic layer of the plurality of organic light-emitting devices and the current supply lines through the contact holes.

According to the above-mentioned means, at least the electrode on one side of one organic light-emitting device belonging to each pixel is connected to the current supply line in a display region of each pixel, so that the wiring resistance of the current supply lines for connecting the electrodes on one side of the organic light-emitting devices and a power source is uniform for each pixel, and the wiring resistance in each pixel is negligibly small; therefore, variations in brightness due to the resistance of the wiring for connecting the electrodes of the organic light-emitting devices and the power source can be reduced, and variations in the brightness in the display region can be suppressed.

Here, a pixel is the minimum unit, a plurality of which are disposed in a matrix form on a screen of a display device for displaying characters or graphics. In addition, a sub-pixel is the minimum unit into which the pixel is further divided, in the display device for performing a color display. A structure in which a color picture is composed of sub-pixels of three colors, namely, green, red and blue sub-pixels, is generally used. Besides, a display region is the region in which a picture is displayed, in a display device.

Here, an organic light-emitting device is a device having a structure in which a first electrode, a first injection layer, a first transport layer, a light-emitting layer, a second transport layer, a second injection layer, a second electrode, and a protective film or a sealing (opposed) substrate are provided on a substrate.

The organic light-emitting device takes either of the following two constitutions.

The first constitution is one in which the first electrode is an anode and the second electrode is a cathode. In this case, the first injection layer and the first transport layer are a hole injection layer and a hole transport layer, respectively. In addition, the second transport layer and the second injection layer are an electron transport layer and an electron injection layer, respectively.

The second constitution is one in which the first electrode is a cathode and the second electrode is an anode. In this case, the first injection layer and the first transport layer are an electron injection layer and an electron transport layer, respectively. In addition, the second transport layer and the second injection layer are a hole transport layer and a hole injection layer, respectively.

In the above constitutions, it is possible to provide a structure which lacks the first injection layer or the second injection layer. Besides, there may be a structure in which the light-emitting layer serves also as the first transport layer or the second transport layer.

Herein, the anode is desirably a conductive film which has a large work function and enhances the injection efficiency of holes. Concrete examples include gold and platinum, but these materials are not limitative.

Besides, the anode may be based on a binary system material, such as indium tin oxide (ITO), indium zinc oxide (IZO), indium germanium oxide, etc., or a ternary system material, such as indium tin zinc oxide, etc. Not only the compositions containing indium oxide as a main constituent, but also compositions containing tin oxide, zinc oxide or the like as a main constituent may be used. In the case of ITO, compositions containing 5 to 10 wt % of tin oxide in indium oxide are often used. Examples of the method of producing the oxide semiconductor include a sputtering method, an EB vapor deposition method, and an ion plating method.

The work functions of an $In_2O_3$—$SnO_2$ based transparent conductive film and an $In_2O_3$—$ZnO$ based transparent conductive film are both 4.6 eV, which can be enhanced to about 5.2 eV by UV ozone irradiation, oxygen plasma treatment or the like.

When the $In_2O_3$—$SnO_2$ based transparent conductive film is formed by sputtering under the condition where the substrate temperature is elevated to about 200° C., the conductive film is obtained in a polycrystalline state. Since the polycrystalline state leads to a bad surface planarity due to the crystal grains, the surface is desirably polished. As another method, formation of the transparent conductive film in an amorphous state and then bringing it into a polycrystalline state by heating is desirably adopted.

With the hole injection layer provided, the anode need not be formed by use of a material having a large work function, but it may be composed of an ordinary conductive film.

Desirable specific examples of the material of the conductive film include metals, such as aluminum, indium, molybdenum, and nickel, alloys of these metals, and inorganic materials, such as polysilicon, amorphous silicon, tin oxide, indium oxide, and indium tin oxide (ITO).

In addition, organic materials, such as polyaniline, and polythiophene, and conductive inks, used with a simple coating method as the formation process of the conductive film may desirably be adopted. These materials are not limitative, and these materials may be used in combination of two or more thereof.

The hole injection layer herein is desirably composed of a material having an appropriate ionization potential in order to lower the injection barrier between the anode and the hole transport layer. Besides, the hole injection layer desirably plays the role of burying the surface roughness of the underlying layer. Concrete examples of the material of the hole injection layer include copper phthalocyanine, starburstoamine compounds, polyaniline, polythiophene, vanadium oxide, molybdenum oxide, ruthenium oxide, and aluminum oxide, which are not limitative.

The hole transport layer herein plays the role of transporting holes and injecting the holes into the light-emitting layer. Therefore, the hole transport layer desirably has a high hole mobility. In addition, the hole injection layer is desirably stable chemically. The hole injection layer desirably has a small ionization potential, and a small electron affinity. Besides, the hole transport layer desirably has a high glass transition temperature. Desirable examples of the material of the hole transport layer include N,N'-bis(3-methylphenyl)-N,N'-diphenyl-[1,1'-biphenyl]-4,4'-diamine (TPD), 4,4'-bis[N-(1-naphthyl)-N-phenylamino]biphenyl (α-NPD), 4,4', 4"-tri(N-carbazolyl)triphenylamine (TCTA), and 1,3,5-tris [N-(4-diphenylaminophenyl)phenylamino]benzene (p-DPA-TDAB). Naturally, these materials are not limitative, and these materials may be used in a combination of two or more thereof.

The light-emitting layer herein is a layer in which the injected holes and electrons are coupled with each other, resulting in emission of light at a wavelength intrinsic of the material. There are a case where the host material itself constituting the light-emitting layer emits light and a case where a dopant material added in a trace amount to the host material emits light. Desirable concrete examples of the host material include distyrilarylene derivatives (DPVBi), silole derivatives having a benzene ring in its skeleton (2PSP), oxodiazole derivatives having triphenylamine structures at both ends (EM2), perinone derivatives having a phenanthrene group (P1), oligothiophene derivatives having triphenylamine structures at both ends (BMA-3T), perylene derivatives (tBu-PTC), tris(8-quinolinol)aluminum, poly-parapheylenevinylene derivatives, polythiophene derivatives, polyparaphenylene derivatives, polysilane derivatives, and polyacetylene derivatives. Naturally, these materials are not limitative, and these materials may be used in combination of two or more thereof.

Desirable specific examples of the dopant material include quinacridone, coumarin-6, Nile Red, rubrene, 4-(dicyanomethylene)-2-methyl-6-(para-dimethylaminostyryl)-4H-pyran (DCM), and dicarbazole derivatives. Naturally, these materials are not limitative, and these materials may be used in a combination of two or more thereof.

The electron transport layer herein plays the role of transporting electrons and injecting the electrons into the light-emitting layer. Therefore, the electron transport layer desirably has high electron mobility. Desirable concrete examples of the material of the electron transport layer include tris(8-quinolinol)aluminum, oxadiazole derivatives, silole derivatives, and zinc-benzothiazole complex. Naturally, these materials are not limitative, and these materials may be used in a combination of two or more thereof.

Examples of methods of manufacturing the hole injection layer, the hole transport layer, the light-emitting layer, and the electron transport layer noted above include a vacuum vapor deposition method, an electron beam (EB) vapor deposition method, a sputtering method, a spin coating method, a cast method, and an ink-jet method.

It is desirable that patterning for each of the layers be performed in the deposition method as follows: a mask provided with an opening shaped correspondingly to the shape of a pattern is kept in intimate contact with or close to a substrate, and, in this state, a material is evaporated from a source of evaporation to the substrate so as to form the pattern thereon.

It is desirable that patterning by the spin coating method and the cast method be performed as follows: a portion other than a pattern of a thin film formed over the entire surface of a substrate is exfoliated by laser ablation or the like, leaving the pattern on the substrate.

It is desirable that patterning for each of the layers be performed in an ink-jet method as follows: a soluble organic material is dissolved in a solvent, and the resulting solution is ejected from a movable nozzle onto a substrate so as to form the shape of a pattern thereon.

The electron injection layer herein is used for enhancing the efficiency of electron injection from the cathode into the electron transport layer. Desirable specific examples of the material of the electron injection layer include lithium fluoride, magnesium fluoride, calcium fluoride, strontium fluoride, barium fluoride, magnesium oxide, and aluminum oxide. Naturally, these materials are not limitative, and these materials may be used in a combination of two or more thereof.

The cathode herein is desirably a conductive film which has a small work function and enhances the injection efficiency of electrons. Specific examples of the material of the cathode include a magnesium-silver alloy, aluminum-lithium alloy, aluminum-calcium alloy, aluminum-magnesium alloy, and metallic calcium, which are not limitative.

With provision of the above-mentioned electron injection layer, the cathode need not be formed by use of a material having a low work function, and a general metallic material can be used. Desirable specific examples include metals, such as aluminum, indium, molybdenum, and nickel, alloys of these metals, polysilicon, and amorphous silicon.

In accordance with the present invention, when the cathode is used as the second electrode (transparent electrode), it is desirable to provide the electron injection layer at a lower portion of the cathode. With provision of the electron injection layer, a transparent conductive film having a high work function can be used as the cathode. Specific examples include an $In_2O_3$—$SnO_2$ based transparent conductive film and an $In_2O_3$—$ZnO$ based transparent conductive film. In particular, the $In_2O_3$—$SnO_2$ based transparent conductive film is used as pixel electrodes in a liquid crystal display system.

The protective layer herein is formed on the second electrode, for the purpose of preventing $H_2O$ and $O_2$ in the atmosphere from penetrating into the second electrode or into the organic layer provided under the second electrode.

Specific examples of the material of the protective layer include inorganic materials, such as $SiO_2$, $SiNx$, and $Al_2O_3$, and organic materials, such as polychloropyrene, polyethylene terephthalate, polyoxymethylene, polyvinyl chloride, polyvinilydene fluoride, cyanoethyl-pullulan, polymethyl methacrylate, polysulfone, polycarbonate, and polyimide, which are not limitative.

BRIEF DESCRIPTION OF THE DRAWINGS

Other objects and advantages of the invention will become apparent from the following description of various embodiments with reference to the accompanying drawings in which:

FIG. 1 is a plan view of a pixel region in an organic light-emitting display device according to a first embodiment of the present invention;

DETAILED DESCRIPTION OF THE PREFERRED EMBODIMENTS

[Embodiment 1]

Figure 2A:
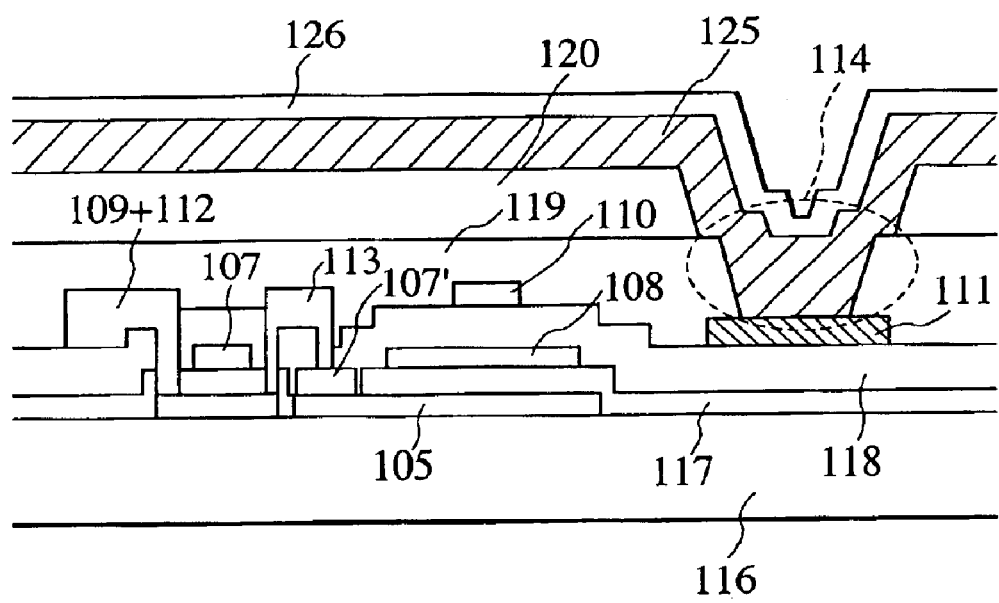
FIG. 2A is a sectional view taken along line A–A' of the pixel region shown in FIG. 1.
Figure 2B:
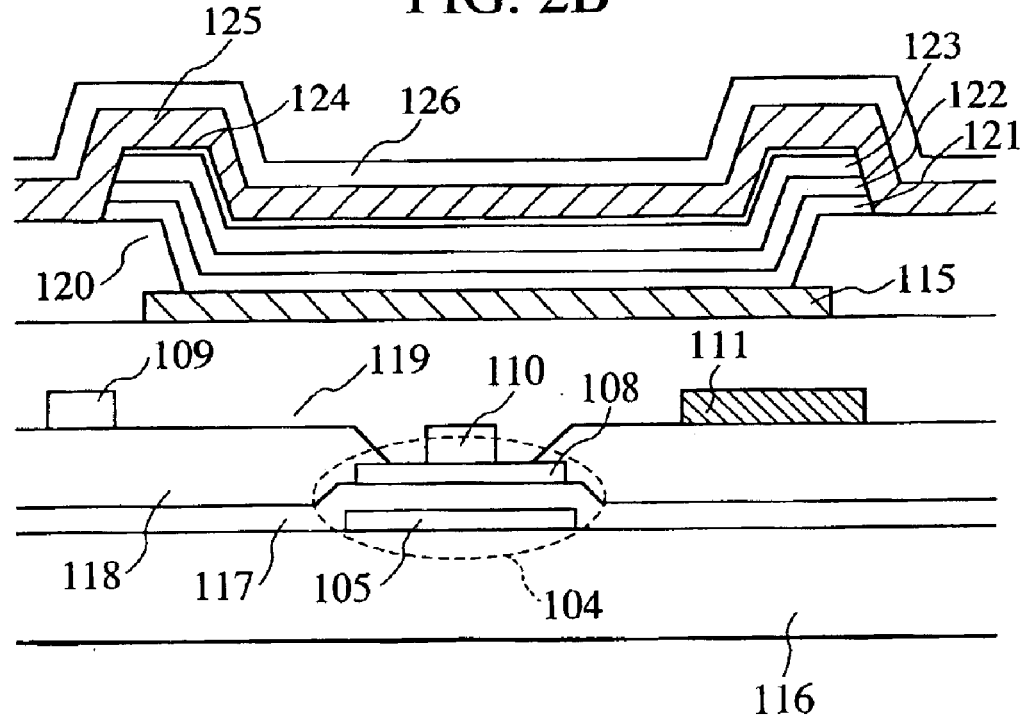
FIG. 2B is a sectional view taken along line B–B' of the pixel region shown in FIG. 1.

An organic light-emitting display system according to a first embodiment of the present invention will be described below with reference to the drawings. FIG. 1 is a plan view of a pixel in the organic light-emitting display device; FIG. 2A is a sectional view taken along line A–A' of FIG. 1; and FIG. 2B is a sectional view taken along line B–B' of FIG. 1. In FIGS. 1, 2A and 2B, a plurality of scanning lines 106, 106' are disposed at a predetermined interval on a glass substrate 116, and signal lines 109, 109', 109" for transmitting picture data and the like are disposed at a predetermined interval in a direction orthogonal to each of the scanning lines. That is, the scanning lines and the signal lines are arranged in a grid form, and the region surrounded by a pair of the scanning lines and a pair of the signal lines constitutes a display region for one pixel. On the glass substrate 116, a plurality of first current supply lines 110 connected to a plus terminal of a power source are disposed in parallel to the signal lines 109, and a plurality of second current supply lines 111 connected to a minus terminal of the power source are disposed in parallel to the signal lines 109 and the first current supply lines 110. The scanning lines 106, the signal lines 109, the first current supply lines 110 and the second current supply lines 111 are provided as wiring belonging to a wiring layer on the glass substrate 116, with an inter-layer insulation film disposed therebetween.

A plurality of organic light-emitting devices constituting a pixel that represents a minimum unit of a color picture is disposed on the upper side of the wiring layer. Each of the organic light-emitting devices is provided as a sub-pixel, which comprises an organic layer including a hole transport layer 121, a light-emitting layer 122, an electron transport layer 123, and an electron injection layer 124, and a first electrode (anode) 115 and a second electrode (cathode) 125 disposed on the opposite sides of the organic layer. The first electrode 115 of the organic light-emitting device belonging to each pixel is connected to the first current supply line 110 through a transistor serving as a driving device, whereas the second electrode 125 of the organic light-emitting device belonging to each pixel is connected to the second current supply line 111 through a contact hole 114 formed in a second interlayer insulation film 119 and a third interlayer insulation film 120 in the display region of each pixel. That is, the second electrode 125 of the organic light-emitting device belonging to each pixel is connected to the second current supply line 111, with the contact hole 114 serving as a feeding point.

On the glass substrate 116, in addition, a driving layer for driving the organic layer of each pixel is provided. The driving layer comprises a first transistor 101, a second transistor 102 and a capacitance 104 as driving devices. The gate of the first transistor 101 is connected to the scanning line 106, the source is connected to the signal line 109, and the drain is connected to the gate of the second transistor and an upper electrode 108 of the capacitance 104. The drain of the second transistor 102 is connected to a lower electrode 105 of the capacitance 104 and the first current supply line 110, and the source is connected to the first electrode 115. FIGS. 1, 2A and 2B show only the structure of one pixel.

Next, a method of manufacturing the organic light-emitting display system constituted as indicated above will be described. First, an amorphous silicon (a-Si) film of 50 nm in thickness is formed on the glass substrate 116 by a low-pressure chemical vapor deposition method (LPCVD method). The material is $Si_2H_6$, and the substrate temperature is set at 450° C. Next, the whole surface of the film is subjected to a laser anneal treatment by use of an XeCl excimer laser. The laser anneal treatment is conducted in two stages, and the irradiation energies at the first time and the second time are 188 mJ/cm$^2$ and 290 mJ/cm$^2$, respectively. With this processing, the amorphous silicon is crystallized to become polycrystalline silicon (p-Si). Next, the polycrystalline silicon is patterned by dry etching using $CF_4$, to form an active layer 103 of the first transistor 101, an active layer 103' of the second transistor 102, and the lower electrode 105 of the capacitance 104.

Next, an $SiO_2$ film of 100 nm in thickness is formed as a gate insulation film 117. The $SiO_2$ film was formed by a plasma-enhanced chemical vapor deposition method (PECVD method) using tetraethoxysilane (TEOS) as a material.

Subsequently, a TiW film of 50 nm in thickness is formed by a sputtering method, and this film is patterned to form gate electrodes 107, 107'. In conjunction with this, the scanning line 106 and the upper electrode 108 of the capacitance are also patterned.

Next, P ions were injected into the patterned polycrystalline silicon layer from the upper side of the gate insulation film 117 by an ion injection method under the conditions of $4 \times 10^{15}$ ion/$cm^2$ and 80 keV. At this time, the P ions are not injected into the regions where the gate electrodes 107, 107' are present on the upper side, and the regions become active regions 103, 103'.

Subsequently, the substrate 116 is heated in an inert $N_2$ gas atmosphere at 300° C. for 3 hours to activate the ions so that doping can be performed effectively. The ion-injected region of the polycrystalline silicon (p-Si) comes to have a sheet resistance of 2 k$\Omega$/□. A silicon nitride (SiNx) film is formed thereon as a first interlayer insulation film 118 with a thickness of 200 nm.

Next, contact holes (not shown) are formed in the gate insulation film 117 and the first interlayer insulation film 118 at upper portions at both ends of the active layers 103, 103'. Further, a contact hole (not shown) is formed in the first interlayer insulation film 118 at an upper portion of the gate electrode 107' of the second transistor 102.

On the upper side of this, an Al film of 500 nm in thickness is formed by a sputtering method. The signal line 109, the first current supply line 110 and the second current supply line 111 are formed by a photolithographic step. In addition, a source electrode 112 and a drain electrode 113 of the first transistor 101, as well as a source electrode 112' and a drain electrode 113' of the second transistor 102, are formed.

Next, the capacitance lower electrode 105 is connected to the drain electrode 113 of the first transistor 101, and the source electrode 112 of the first transistor 101 is connected to the signal line 109. In addition, the drain electrode 113 of the first transistor 101 is connected to the gate electrode 107' of the second transistor 102, and the drain electrode 113' of the second transistor 102 is connected to the first current supply line 110. Further, the upper electrode 108 of the capacitance 104 is connected to the first current supply line 110.

Subsequently, an SiNx film is formed through the second interlayer insulation film 119. The SiNx film has a thickness of 500 nm. A contact hole (not shown) is formed at an upper portion of the drain electrode 112' of the second transistor 102, and an ITO film of 150 nm in thickness is formed thereon by a sputtering method, and the first electrode 115 is formed by a photolithographic method.

Next, as a third interlayer insulation film 120, a positive type photosensitive protective film (PC452), a product by JSR, is formed. In this case, the film is formed by a spin coating method under coating conditions of 1000 rpm and 30 sec, the substrate 116 is placed on a hot plate, and prebaking is performed at 90° C. for 2 min.

Subsequently, exposure to a ghi line mixture is conducted by use of a photomask to form contact holes 114 in a stripe pattern. Next, development is conducted by use of a developing liquid PD-523, a product by JSR, at room temperature for 40 sec, and, after the development, rinsing with pure water is carried out at room temperature for 60 sec. After the rinsing, post-exposure is conducted at a wavelength of 365 nm and an intensity of 300 mJ/$cm^2$, and post-baking is conducted in a clean oven at 220° C. for 1 hr.

The thickness of the third interlayer insulation film 120 formed of PC452 is 2 $\mu$m, and the edges of the first electrode 115 are covered by 6 $\mu$m.

Next, the structure of the organic light-emitting device constituting a pixel will be described with reference to FIG. 2B. The glass substrate 116, provided with elements up to the first electrode 115, is subjected to ultrasonic cleaning for 3 min sequentially in acetone and in pure water, followed by spin drying and drying in an oven at 120° C. for 30 min.

Subsequently, $O_2$ plasma cleaning is conducted. The degree of vacuum in the plasma-cleaning chamber is 3 Pa, the flow rate of $O_2$ is 22 ml/min, the RF power is 200 W, and the cleaning time is 3 min. After the $O_2$ plasma cleaning, the substrate 116 is set into a vacuum vapor deposition chamber without exposure to the atmosphere.

Next, a 4,4-bis[N-(1-naphthyl)-N-phenylamino]biphenyl film (hereinafter referred to as α-NPD film) of 50 nm in thickness is formed on the first electrode 115 by a vacuum vapor deposition method.

About 60 mg of the material is put in a Mo-made sublimation boat, and vapor deposition is conducted at a vapor deposition rate of 0.15±0.05 nm/sec. At this time, the pattern is formed by use of a shadow mask. The vapor deposition area is 1.2 times each side of the first electrode 115. The α-NPD film functions as a hole transport layer 121.

On the upper side of this, a co-vapor deposition film of tris(8-quinolinol)aluminum and quinacridon (hereinafter referred to as Alq and Qc, respectively) of 20 nm in thickness is formed by a binary simultaneous vacuum vapor deposition method.

The materials Alq and Qc in amounts of about 40 mg and about 10 mg are put in two Mo-made sublimation boats, respectively, and co-vapor deposition is conducted at vapor deposition rates of 0.40±0.05 nm/sec and 0.01±0.005 nm/sec, respectively. The Alq+Qc co-vapor deposition film functions as the light-emitting layer 122. An Alq film of 20 nm in thickness is formed thereon by a vacuum vapor deposition method. About 40 mg of the material is put in an Mo-made sublimation boat, and vapor deposition is conducted at a vapor deposition rate of 0.15±0.05 nm/sec. The Alq film functions as the electron transport layer 123.

A mixture of Mg and Ag, serving as the electron injection layer 124 is formed on the electron transport layer 123. In this case, a film of 10 nm in thickness is formed by a binary simultaneous vacuum vapor deposition method at vapor deposition rates of 0.14±0.05 nm/sec and 0.01±0.005 nm/sec for Mg and Ag, respectively.

Next, an In—Zn—O film (hereinafter referred to as an IZO film) of 50 nm in thickness is formed by a sputtering method. The film functions as the second electrode 125 and is an amorphous oxide film. A target with In/(In+Zn)=0.83 is used. The film formation conditions include an Ar:$O_2$ mixture gas as the atmosphere, a degree of vacuum of 0.2 Pa, and a sputtering output of 2 W/$cm^2$. The second electrode 125 composed of an Mg:Ag/In—Zn—O laminate film functions as a cathode, which has a transmittance of 65%. In this case, as shown in FIG. 2A, the second electrode 125 is connected to the second current supply line 111, with the contact hole 114 formed in the second interlayer insulation film 119 and the third interlayer insulation film 120 serving as a feeding point. That is, the second electrode 125 of the organic light-emitting device of each pixel is connected to the second current supply line 111 in the region of each pixel, using the contact hole 114 as a feeding point.

Subsequently, an SiNx film of 50 nm in thickness is formed on the second electrode 125 by a thermal CVD method. This film functions as the protective film 126.

In the organic light-emitting display device according to the present embodiment, the emitted light is taken out from the side of the protective layer 126, so that the IZO film is used as the second electrode 125. The IZO film has a sheet resistance of 80 Ω/□.

Figure 3A:
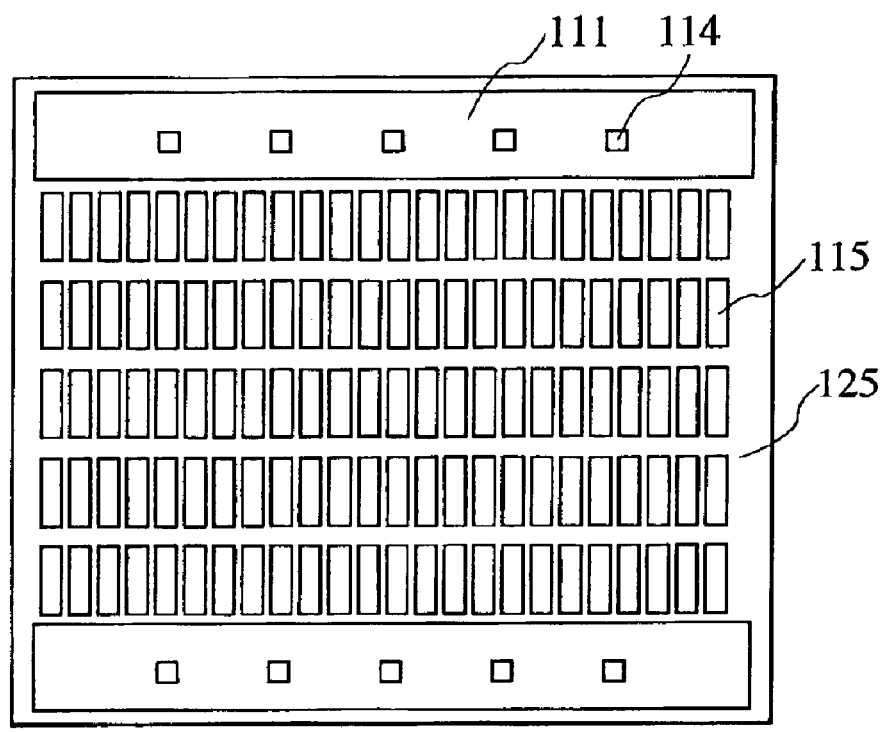
FIG. 3A is a schematic diagram illustrating the relationship between a second current supply line and a feeding point in a conventional organic light-emitting display device.

In the case of using the IZO film as the second electrode 125 and connecting the second electrode 125 to the second current supply line 111, when the feeding point for the second electrode 125 of each pixel is provided at an end portion of the display region of the panel, and this feeding point is connected to the second electrode 125 of each pixel through the second current supply line 111, as shown in FIG. 3A, differences are generated in the wiring resistance due to the IZO film between the pixels disposed at the end portion of the display region of the panel and the pixels disposed at a central portion of the display region of the panel, so that variations are generated in the voltage applied to each pixel, and thereby variations occur in the brightness of the panel.

Figure 3B:
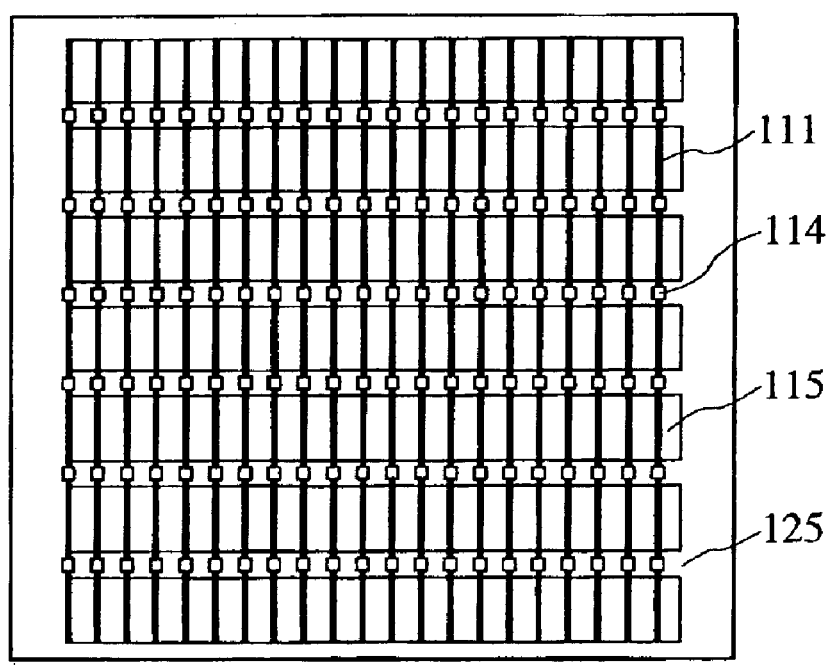
FIG. 3B is a schematic diagram illustrating the relationship between a second current supply line and a feeding point in an organic light-emitting display device according to the present invention.

On the other hand, in the organic light-emitting display device according to this embodiment, as shown in FIGS. 2A, 2B and 3B, the second electrode 125 of the organic light-emitting device of each pixel and the second current supply line 111 are connected to each other in the display region of each pixel, with the contact hole 114 serving as a feeding point Therefore, the wiring resistance due to the IZO film in each pixel becomes uniform, so that generation of the variations in the voltage applied to each pixel can be prevented, and thereby generation of the variations in the brightness of the panel can be prevented.

In addition, the second current supply line 111 in this embodiment has a total wiring resistance of about 0.2 Ω, so that the wiring resistance in each pixel is negligibly small, and the generation of the variations in the brightness of the panel can be suppressed.

[Embodiment 2]

Figure 4:
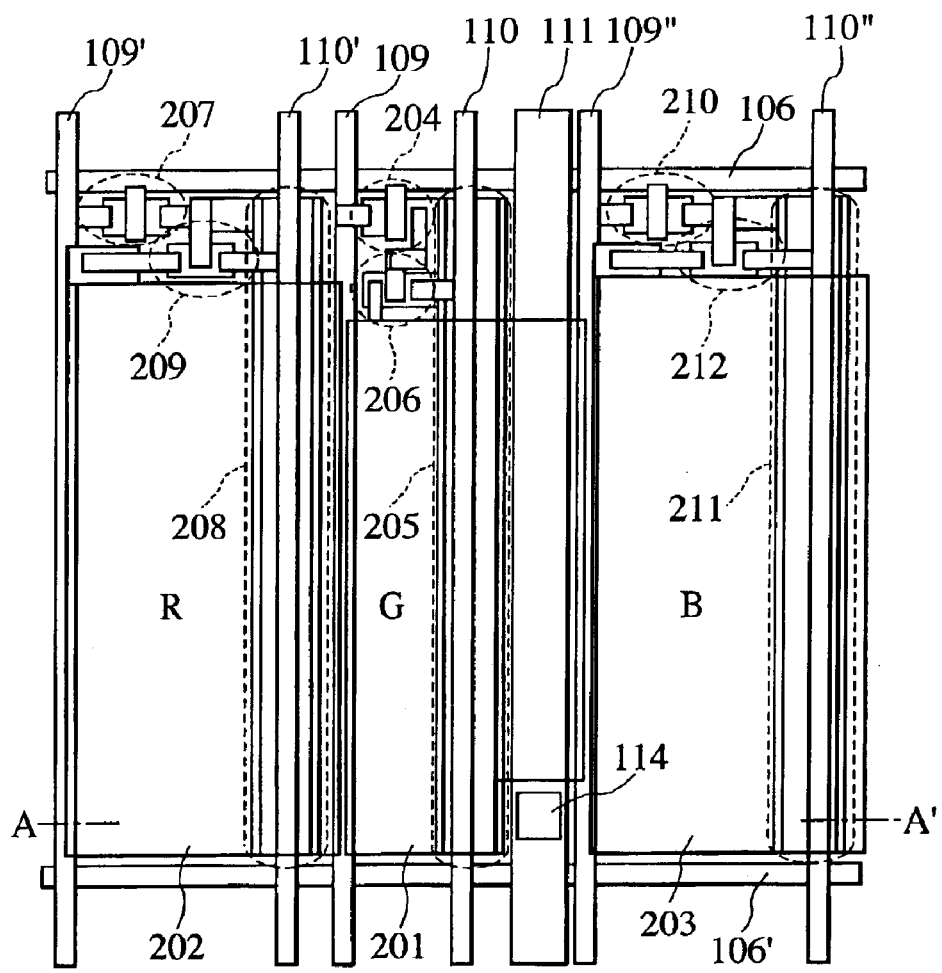
FIG. 4 is a plan view of a pixel region in an organic light-emitting display system according to a second embodiment of the present invention.
Figure 5:
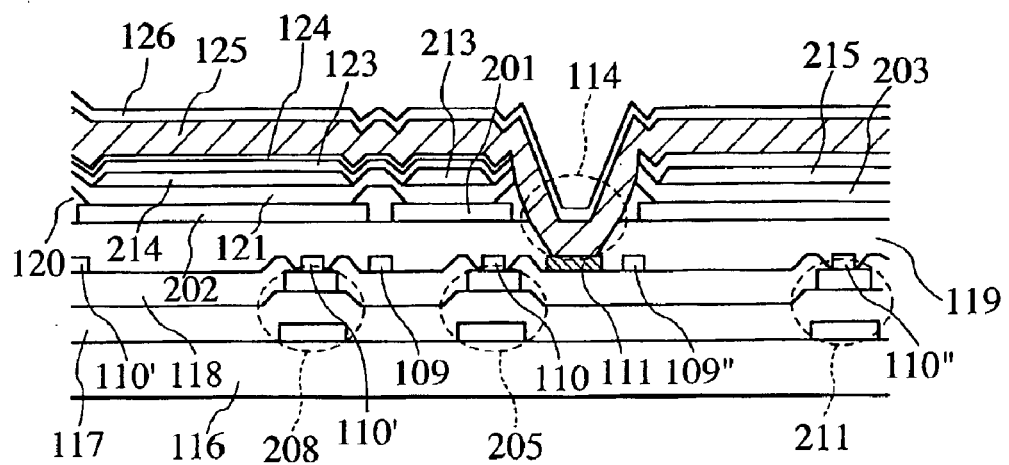
FIG. 5 is a sectional view taken along line A–A' of the pixel region shown in FIG. 4.

A full color organic light-emitting display device according to a second embodiment of the present invention will be described with reference to FIGS. 4 and 5. This display device comprises a second current supply line and a feeding point at a lower portion of a green emission pixel region, and it has a high efficiency and a long life. FIG. 4 is a plan view of a pixel of an organic light-emitting display device according to this embodiment, and FIG. 5 is a sectional view taken along line A–A' of the pixel region shown in FIG. 4.

The present embodiment has a structure in which, to display a color picture, a plurality of pixels serving as minimum units of the color picture are provided; green, red and blue organic light-emitting devices are provided as sub-pixels constituting each pixel; and a second electrode 125 of the organic light-emitting device of each pixel is connected to a second current supply line 111 in the display region of the green organic light-emitting device, the other constitutions being substantially the same as those in the first embodiment.

More particularly, there are formed on a glass substrate 116a, a green pixel first transistor 204, a green capacitance 205, a green second transistor 206, a red pixel first transistor 207, a red capacitance 208, a red second transistor 209, a blue pixel first transistor 210, a blue capacitance 211, a blue second transistor 212, signal lines 109, 109', 109", scanning lines 106, 106', first current supply lines 110, 110', 110", a second current supply line 111, a first interlayer insulation film 118, a second inter-layer insulation film 119 and a contact hole 114, using the same methods as in the first embodiment The organic light-emitting devices constituting the green pixel, red pixel and blue pixel are formed by the following method.

A green pixel first electrode 201, a red pixel first electrode 202 and a blue pixel first electrode 203 are formed on the second interlayer insulation film 119. The method used for this is the same as that for forming the first electrode 115 in the first embodiment. The first electrodes 201, 202, 203 are connected respectively to source electrodes of the second transistors 206, 209, 212 through contact holes (not shown) formed in the second interlayer insulation film 119, and the green pixel first electrode 201 is not covered with the feeding point constituted of the contact hole 114.

Next, as with the first embodiment, a third interlayer insulation film 120 is formed, and the third interlayer insulation film 120 is also not covered with the feeding point constituted of the contact hole 114.

Subsequently, an α-NPD layer serving as a hole transport layer 121 in common for each pixel is formed on the first electrodes 201, 202, 203. The formation conditions are the same as in Embodiment 1, the film thickness is controlled to 50 nm, and the vapor deposition rate is controlled to 0.15±0.05 nm/sec. The vapor deposition is conducted by use of a mask so that the feeding point is not covered with the hole transport layer 121.

Next, light-emitting layers 213, 214, 215 of each pixel are formed. A co-vapor deposition layer of Alq and Qc is formed as the light-emitting layer 213 of the green pixel. The formation conditions are the same as in the first embodiment.

Subsequently, the light-emitting layer 214 of the red pixel is formed. That is, a co-vapor deposition film of Alq and Nile Red (hereinafter abbreviated to Nr) of 40 nm in thickness is formed by a binary simultaneous vacuum vapor deposition method.

The materials Alq and Nr in respective amounts of about 10 mg and about 5 mg are put in two Mo-made sublimation boats, and vapor deposition is conducted at vapor deposition rates of 0.40±0.05 nm/sec and 0.01±0.005 nm/sec for Alq and Nr, respectively.

Next, the light-emitting layer 215 of the blue pixel is formed. That is, a distyrylarylene derivative film (hereinafter abbreviated to DPVBi) of 40 nm in thickness is formed by a vacuum vapor deposition method. The material DPVBi, in an amount of about 40 mg, is put in an Mo-made sublimation boat, and vapor deposition is conducted at a vapor deposition rate of 0.40±0.05 nm/sec.

Subsequently, an electron transport layer 123, common for each pixel, is formed. That is, an Alq film of 20 nm in thickness is formed by a vacuum vapor deposition method. In this case, about 40 mg of the material is put in an Mo-made sublimation boat, and vapor deposition is conducted at a vapor deposition rate of 0.15±0.05 nm/sec.

Next, an Mg—Ag alloy film serving as an electron injection layer 124 is formed on the electron transport layer 123. The formation conditions are the same as in the first embodiment. An IZO film serving as a second electrode 125 is formed thereon. The formation conditions are the same as in the first embodiment.

The second electrode 125 is connected to the second current supply line 111, with the contact hole 114 formed in the second interlayer insulation film 118 and the third interlayer insulation film 119 serving as a feeding point.

Subsequently, an SiNx film of 50 nm in thickness is formed by a thermal CVD method. This film functions as a protective layer 126.

In this embodiment, as with the first embodiment, the contact hole 114 is provided for connecting the second electrode 125 and the second current supply line 111 in the display region of each pixel, so that variations in wiring resistance due to the second electrode 125 are suppressed, and the variations in brightness of the panel can be reduced.

In addition, in this embodiment, the second current supply line 111 is formed in the green pixel region and is not formed in the red pixel and blue pixel regions, so that lowering of the aperture ratio due to formation of the contact hole 114 is not generated in the red pixel and blue pixel region, though a lowering of the aperture ratio is generated in the green pixel region. In this case, if the lowering of the aperture ratio in the green pixel region is 10%, it is possible to accommodate the lowering of the aperture ratio by increasing the brightness by 10%. In other words, since the current density is proportional to the brightness, it is possible to accommodate the lowering of the aperture ratio by increasing the current density by 10%. It should be noted that even if the current density is increased by 10%, the current flowing to the green pixel is not varied because the aperture ratio is lowered by 10%.

On the other hand, if the brightness in a non-linear relationship with the voltage is increased by 10%, the voltage is increased by 1 to 2%. Therefore, if the brightness is increased by 10%, the increase in power is 1 to 2%. Incidentally, the efficiency of the organic light-emitting device used for the green pixel is several fold greater than those of the materials of the red and blue devices, so that the increase in power does not matter in a full-color panel.

Therefore, by adopting the structure according to this embodiment, variations in brightness in the panel can be suppressed without lowering the efficiency of the full-color panel.

[Embodiment 3]

Figure 6:
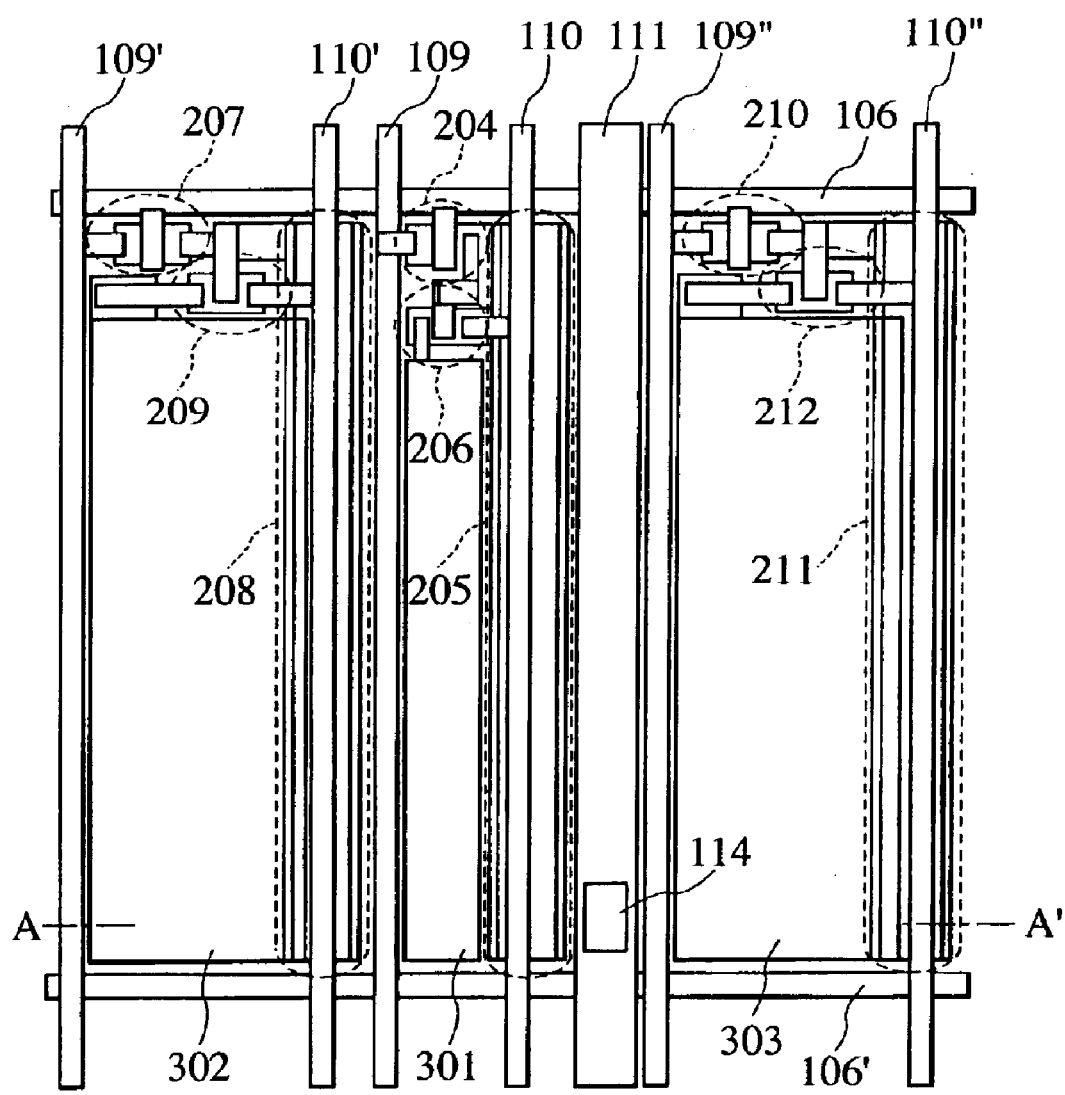
FIG. 6 is a plan view of a pixel region in an organic light-emitting display system according to a third embodiment of the present invention.
Figure 7:
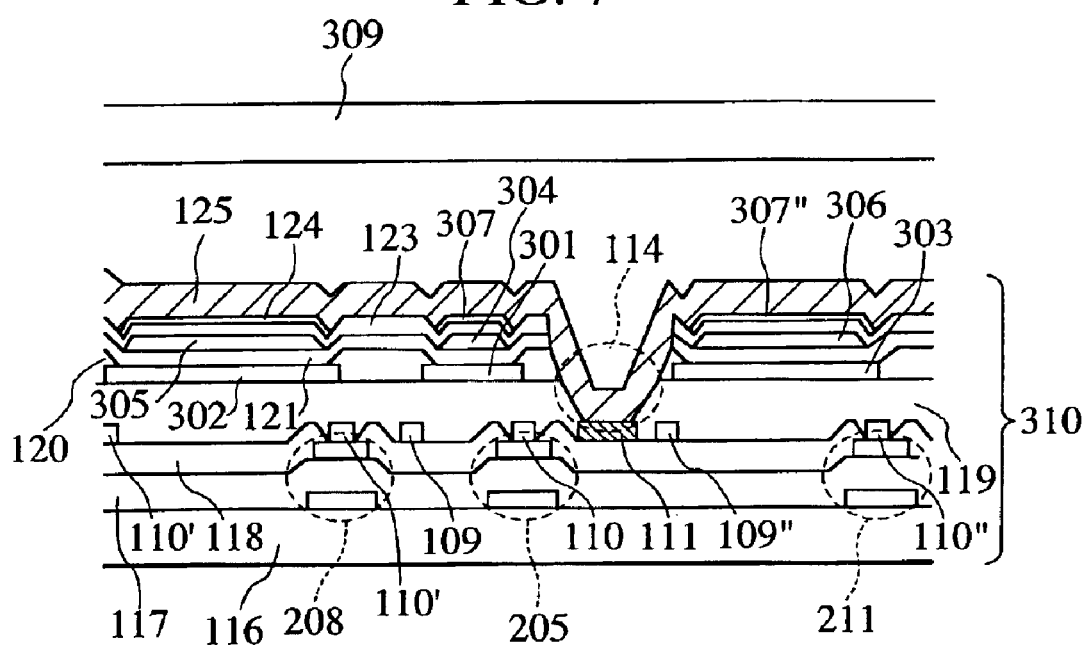
FIG. 7 is a sectional view taken along line A–A' of the pixel region shown in FIG. 6.

A full-color organic light-emitting display device according to a third embodiment of the present invention will be described with reference to FIGS. 6 and 7. This display device, which comprises a second current supply line and a feeding point at a lower portion of a green light emission pixel region, is so constructed as to take out light from the back side of a substrate, and has a high efficiency and a long life. FIG. 6 is a plan view of a pixel of the organic light-emitting display device in this embodiment, and FIG. 7 is a sectional view taken along line A–A' of FIG. 6.

In this embodiment, a sealing substrate 309 for the purpose of preventing water, oxygen and the like gases in the atmosphere from penetrating into a second electrode 125, an organic layer under the second electrode, or the interface between the second electrode and the organic layer is provided on the upper side of the second electrode 125, the other constitutions being substantially the same as in the second embodiment.

More particularly, there are formed on a glass substrate 116, a green pixel first transistor 204, a green capacitance 205, a green second transistor 206, a red pixel first transistor 207, a red capacitance 208, a red second transistor 209, a blue pixel first transistor 210, a blue capacitance 211, a blue second transistor 212, signal lines 109, 109', 109", scanning lines 106, 106', first current supply lines 110, 110', 110", a second current supply line 111, a first inter-layer insulation film 118, and a second inter-layer insulation film 119, using the same methods as used in the second embodiment.

Next, first electrodes 301, 302, 303 of green, red and blue pixels are formed on the second interlayer insulation film. The formation conditions are the same as in the second embodiment. This embodiment differs from the second embodiment in that the green pixel first electrode 301 is so small that it does not overlap with the capacitance 205, the first current supply line 110 or the second current supply line 111.

Subsequently, as with the second embodiment, a contact hole 114 is formed in the second interlayer insulation film 119 and the third interlayer insulation film 120, and the contact hole 114 is provided to serve as a feeding point.

On the upper side of this, a hole transport layer 121 is formed in common for green, red and blue pixels. The method of formation is the same as in the second embodiment.

Next, light-emitting layers 304, 305, 306 of each pixel are formed by the same method as used in the second embodiment.

An electron transport layer 123 common for green, red, blue pixels is formed on the light-emitting layers 304, 305, 306 of each pixel, by the same method as used in Embodiment 2.

Subsequently, an LiF film serving as an electron injection layer 124 is formed on the electron transport layer 123. The film of 0.5 nm in thickness was formed by a vacuum vapor deposition method at a vapor deposition rate of 0.05±0.01 nm/sec.

Next, an Al film serving as a second electrode 125 is formed on the electron injection layer 124. The film of 150 nm in thickness is formed by a vacuum vapor deposition method at a vapor deposition rate of 1±0.05 nm/sec.

The second electrode 125 is connected to the second current supply line 111, with the contact hole 114 formed in the second inter-layer insulation film 119 and the third inter-layer insulation film 120 serving as a feeding point.

Subsequently, the substrate (organic EL substrate) 106 provided with the driving portions and the organic light-emitting devices is moved into a sealed chamber, in which the dew point is maintained at −90° C. while circulating a dried nitrogen gas, without exposing the substrate 106 to the atmosphere.

Next, a glass substrate is introduced into the sealed chamber. The glass substrate becomes a sealing substrate (opposed substrate) 309. A photo-curable resin was applied to edge portions of the sealing substrate 309 constituted of the glass substrate by use of a seal dispenser device.

The sealing width of the photo-curable resin is 200 μm. Glass beads of 10 μm in diameter are loaded in the photo-curable resin in an amount of 1 wt %. The sealing substrate 309 and the organic EL substrate 310 are adhered to each other in the sealed chamber, and they are pressed against each other under a load of 0.5 kgw/cm². A light shield plate is placed on the outside of the sealing substrate 309 so that the whole part of the display region is shielded from UV light, and irradiation with UV light from the side of the sealing substrate 309 is conducted to cure the photo-curable resin.

An alkali meta-halide lamp is used as a source of UV light at an irradiation intensity of 4000 mJ/cm² for an irradiation time of 4 min.

The gap length between the organic EL substrate 310 and the sealing substrate 309 is determined by the diameter of the glass beads contained in the photo-curable resin to be 10 μm.

In this embodiment, as with the first embodiment, a feeding point for connecting the second electrode 125 and the second current supply line 111 is provided in the inside of the pixel, so that dispersion of the wiring resistance due to the resistance of the second electrode 125 is suppressed, and variations in the brightness of the panel are reduced.

Besides, in this embodiment, as with the second embodiment, the second current supply line 111 is formed only at a lower portion of the green pixel region, so that the current per pixel is not varied even in the case where the aperture ratio of the green pixel is about 50%. On the other hand, the voltage is increased by about 7%. Therefore, in this embodiment, the power is increased by about 7%, but this does not lead to a lowering of the performance of the full-color panel in the same manner as in the second embodiment.

[Embodiment 4]

Figure 8:
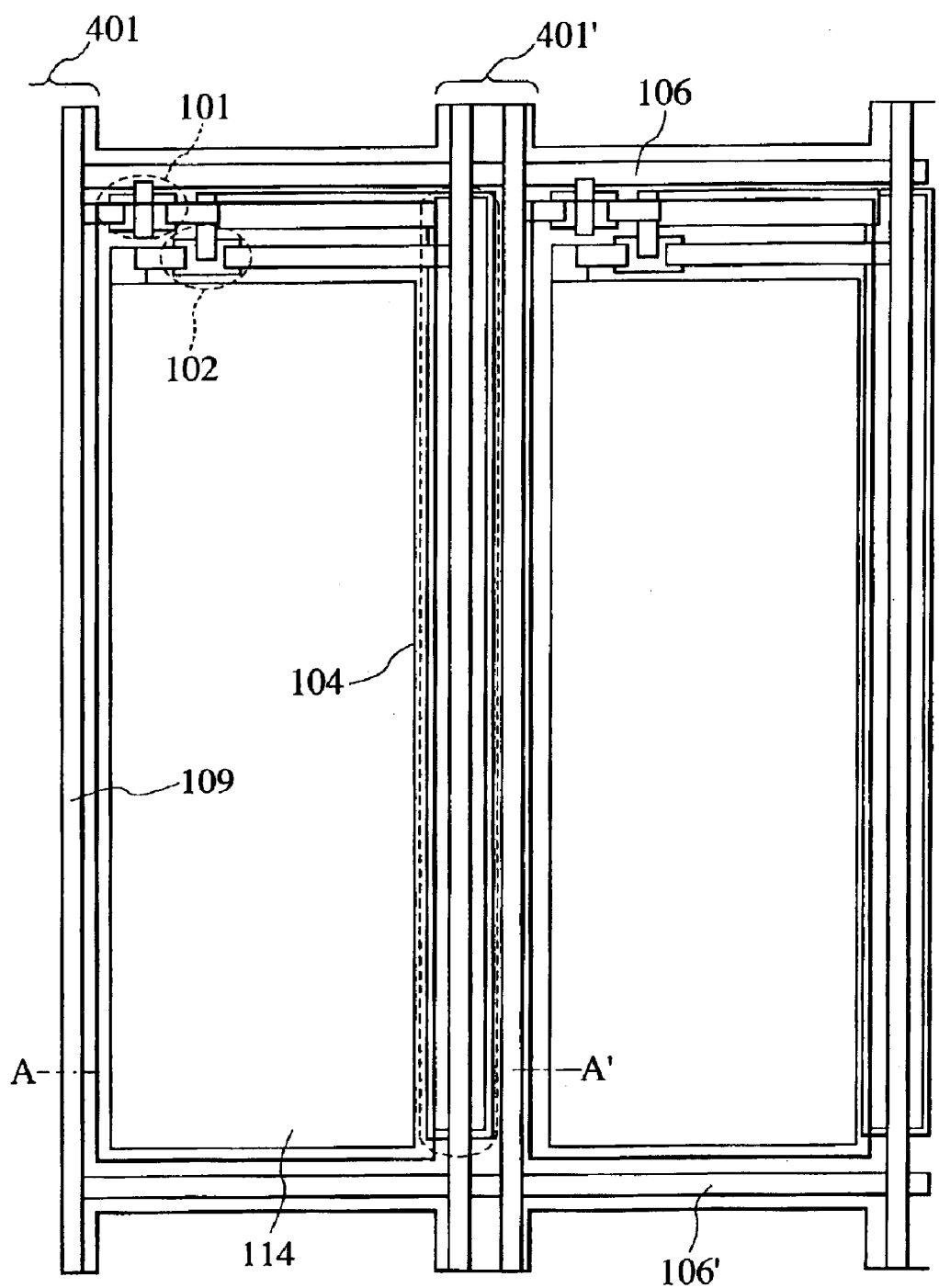
FIG. 8 is a plan view of a pixel region in an organic light-emitting display system according to a fourth embodiment of the present invention.
Figure 9:
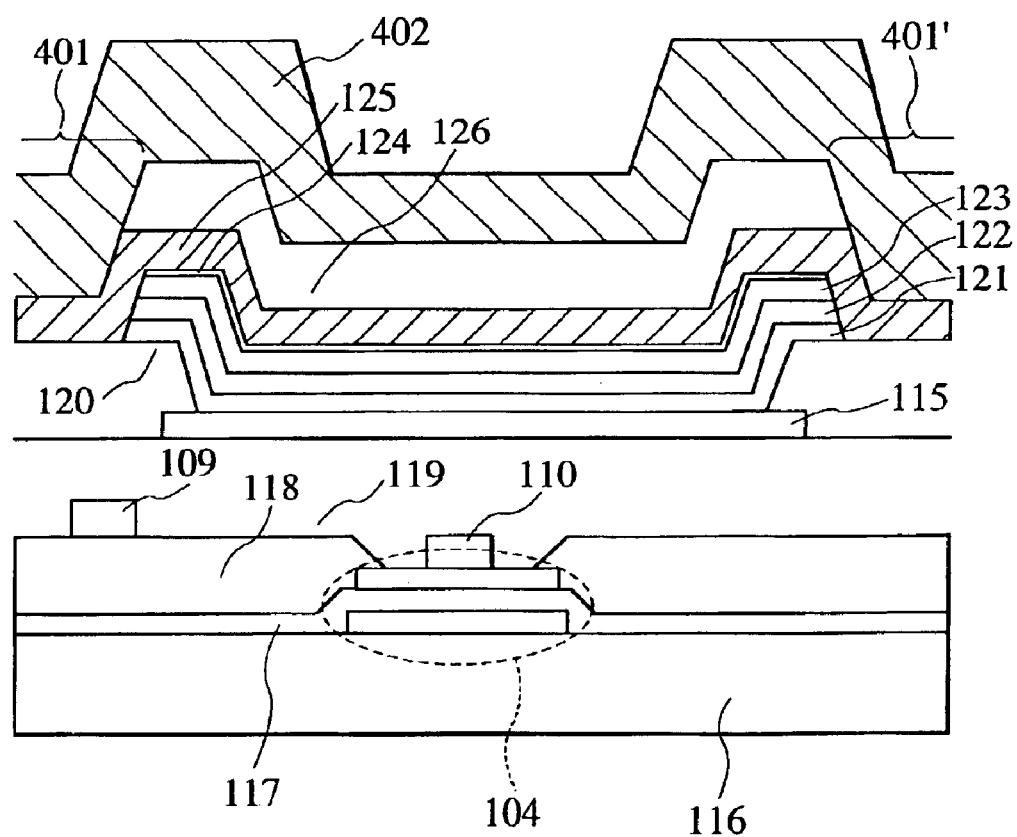
FIG. 9 is a sectional view taken along line A–A' of the pixel region shown in FIG. 8.

A full-color organic light-emitting display device according to a fourth embodiment of the present invention will be described with reference to FIGS. 8 and 9. This display device comprises a second current supply line on the upper side of a second electrode. FIG. 8 is a plan view of a pixel of the organic light-emitting display device according to this embodiment, and FIG. 9 is a sectional view taken along line A–A' of FIG. 8.

In this embodiment, in place of forming a second current supply line 111 in the same layer as a signal line 109, an Al film 402 serving as the second current supply line is formed on the upper side of a protective layer 126 covering a second electrode 125 of an organic light-emitting device belonging to each pixel, and emitted light is taken out from the back side of the substrate, the other constitutions being substantially the same as in the first embodiment.

More particularly, there are formed on a glass substrate 116, a first transistor 101, a capacitance 104, a second transistor 102, signal lines 109, 109', scanning lines 106, 106', first current supply lines 110, 110', a second inter-layer insulation film 119, a first electrode 115, and a third interlayer insulation film 120, using the same methods as used in the first embodiment.

On the upper side of this, a hole transport layer 121, a light-emitting layer 122 and an electron transport layer 123 are formed by the same method as used in the embodiment.

Next, an LiF film serving as an electron injection layer 124 is formed on the electron transport layer 123 under the same conditions as in the third embodiment.

Subsequently, an Al film serving as a second electrode 124 is formed on the electron injection layer 124 under the same conditions as in the third embodiment.

Next, an SiNx film of 100 nm in thickness is formed by a thermal CVD method. The film is removed, while leaving an upper portion on the pixel region where the first electrode 115 and the second electrode 125 overlap with each other, by a photolithographic method. In FIGS. 8 and 9, the removed regions are regions 401 and 401'. In this case, the SiNx film functions as a protective layer 126 in the pixel region.

An Al film is formed on the protective layer 126 by a sputtering method to a film thickness of 500 nm. This layer functions as a second current supply line. With the protective film 126 provided in the pixel region, the damage to the electron transport layer 123, the light-emitting layer 122 and the hole transport layer 121 as lower layers due to the formation of the Al film is reduced.

In the organic light-emitting display system according to this embodiment, the second current supply line 402, that is formed at an upper portion of the second electrode 125 of each pixel, is connected to the second electrode 125 through the contact hole (not shown) formed in the protective layer 126 and the regions 401, 401' in the vicinity of each pixel, so that variations in the wiring resistance of the second electrode 125 are reduced, and, as a result, variations in the brightness of the panel surface can be reduced.

In addition, since the second current supply line 402 formed on the protective layer 126 has a protective function, the life of the organic light-emitting display device can be prolonged.

[Embodiment 5]

Figure 10:
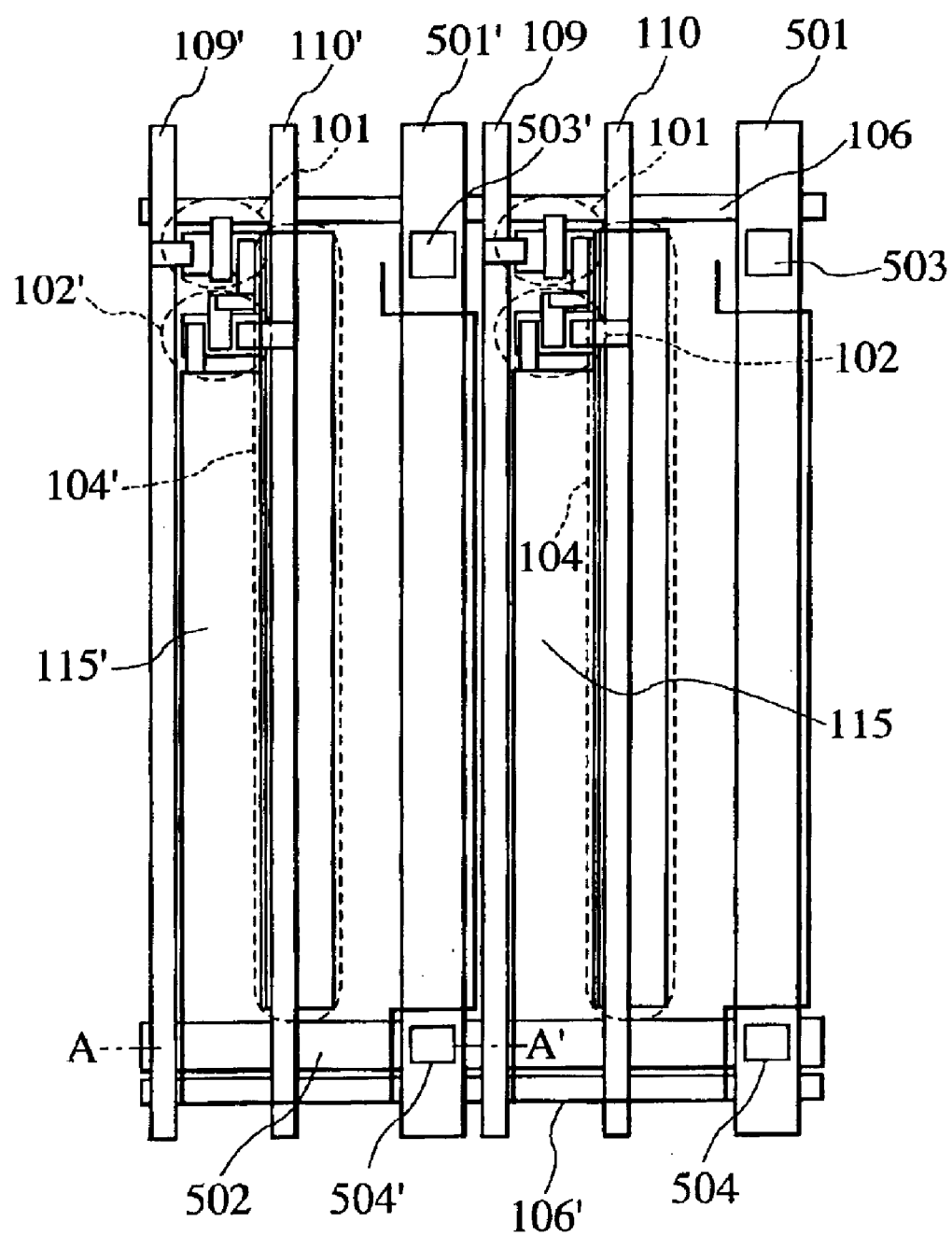
FIG. 10 is a plan view of a pixel region in an organic light-emitting display system according to a fifth embodiment of the present invention.
Figure 11:
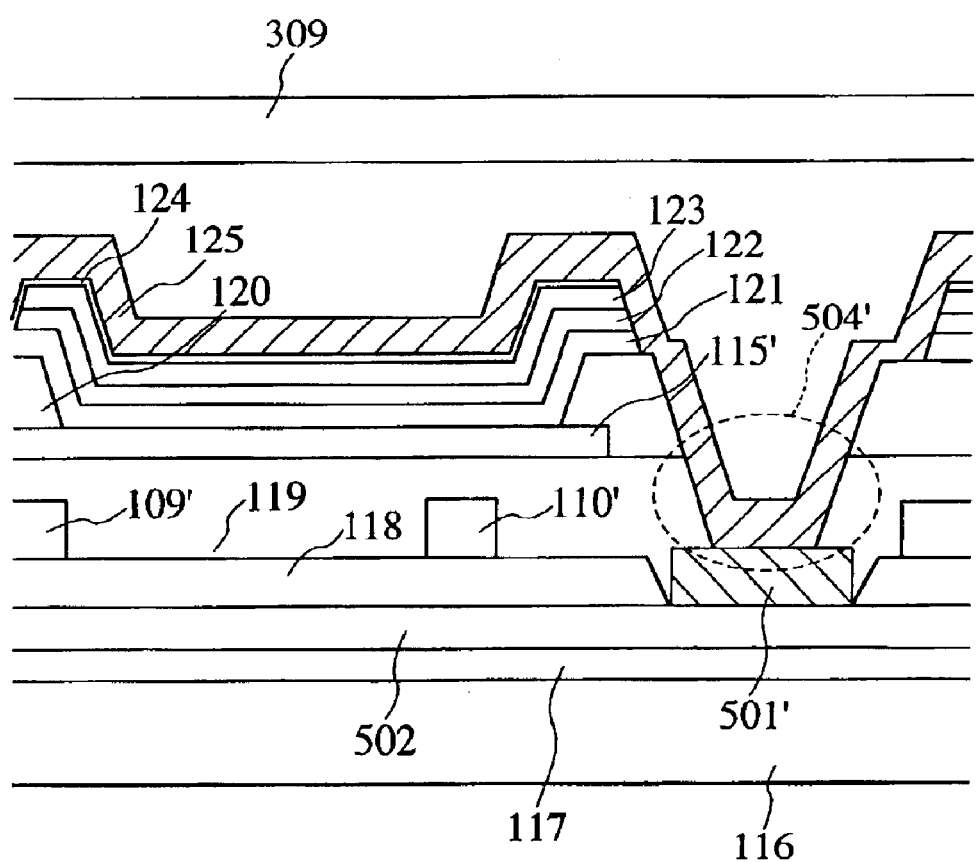
FIG. 11 is a sectional view taken along line A–A' of the pixel region shown in FIG. 10.

An organic light-emitting display device according to a fifth embodiment of the present invention will be described with reference to FIGS. 10 and 11. This display device comprises second current supply lines in a mesh form (grid form). FIG. 10 is a plan view of a pixel of the organic light-emitting display device according to this embodiment, and FIG. 11 is a sectional view taken along line A–A' of FIG. 10.

In this embodiment, in forming the second current supply lines in a mesh form, the second current supply lines 501, 501' are formed in parallel to signal lines 109, 109', and the second current supply line 502 is formed in parallel to scanning lines 106, 106', so that the area of the second current supply lines as a whole is increased, whereby a lowering in the resistance of the second current supply lines is achieved, the other constitutions being substantially the same as in the first and second embodiments.

More particularly, an active layer 103 of a first transistor 101, an active layer 103' of a second transistor 102, and a lower electrode 105 of a capacitance are formed on a glass substrate 116 by the same methods as in the first embodiment.

Next, a gate insulation film 117 is formed by the same method as used in the first embodiment. On the upper side of this, a gate electrode 107, the scanning lines 106, 106', and an upper electrode 108 of the capacitance are formed by patterning. In this layer, the second current supply line 502 is formed.

On the upper side of this, a first inter-layer insulation layer 118 is formed under the same conditions as in the first embodiment.

Next, contact holes are formed in the gate insulation film 117 and the first interlayer insulation layer 118 at upper portions of both ends of the active layers 103, 103'. Further, a contact hole is formed in the first interlayer insulation layer 127 at an upper portion of the gate electrode 121 of the second transistor 102. Furthermore, a contact hole 504' is formed on the second current supply line 502.

On the upper side of this, a signal line 109, a first current supply line 110 and the second current supply lines 501, 501' are formed in the same manner as in the first embodiment. The second current supply line 502 is connected to the second current supply line 501' at a feeding point 504'.

In addition, a source electrode 112 and a drain electrode 113 of the first transistor 101, as well as a source electrode 112' and a drain electrode 113' of the second transistor 102, are formed.

The capacitance lower electrode 105 is connected to the drain electrode 113 of the first transistor 101, the source electrode 112 of the first transistor 101 is connected to the signal line 109, and the drain electrode 113 of the first transistor 101 is connected to the gate electrode 107' of the second transistor 102. In addition, the drain electrode 102' of the second transistor 102 is connected to the first current supply line 110, and the capacitance upper electrode 108 is connected to the first current supply line 110.

Next, the second interlayer insulation layer 118, the first electrode 114 and the third interlayer insulation layer 119 are formed in the same manner as in the first embodiment. On the upper side of this, a hole transport layer 121, a light-emitting layer 122, an electron transport layer 123, an electron injection layer 124, and a second electrode 125 are formed by the same methods as in the first embodiment.

The second electrode 125 is connected to the second current supply line 501' at the feeding points 503', 504'.

Thereafter, the substrate provided with the driving devices and the organic light-emitting devices and a sealing substrate 309 are adhered to each other in the same manner as in the third embodiment.

In the organic light-emitting display system according to this embodiment, the second electrode 125 and the second current supply lines 501', 502' are connected to each other in the display region of each pixel, so that variations in the wiring resistance of the second electrode 125 are reduced. In particular, since the second current supply lines 501', 502' are formed in a mesh form, the wiring resistance of the second current supply lines is further lowered, and, as a result, variations in the brightness of the panel surface can be reduced.

The embodiment of the invention adopts a mesh configuration in which the second current supply lines are disposed in the directions of the signal lines (the longitudinal direction) and the scanning lines (lateral direction) for each sub-pixel. To reduce the variations in the wiring resistance, the second current supply lines are not necessarily disposed in the longitudinal and lateral directions for every sub-pixel. For example, the second current supply lines are disposed in the longitudinal direction for each sub-pixel as with this embodiment, while the second current supply lines are disposed in the lateral direction only for sub-pixels located at the central portion of the display region. This configuration reduces the variations in the wiring resistance as compared with a configuration in which the second current supply lines are disposed only in the longitudinal direction. In addition, as compared with the fifth embodiment, although the variation in the wiring resistance is increased, the number of the contact holes that connect the second current supply lines disposed in the longitudinal direction with the second current supply lines disposed in the lateral direction is decreased, which improves a process percent defective.

The second current supply lines disposed in the lateral direction may be formed every two, three or four sub-pixels. In addition, even if the dispositions of the second current supply lines formed in the lateral and longitudinal directions are exchanged for each other, the same effects can be produced.

[Embodiment 6]

Figure 12:
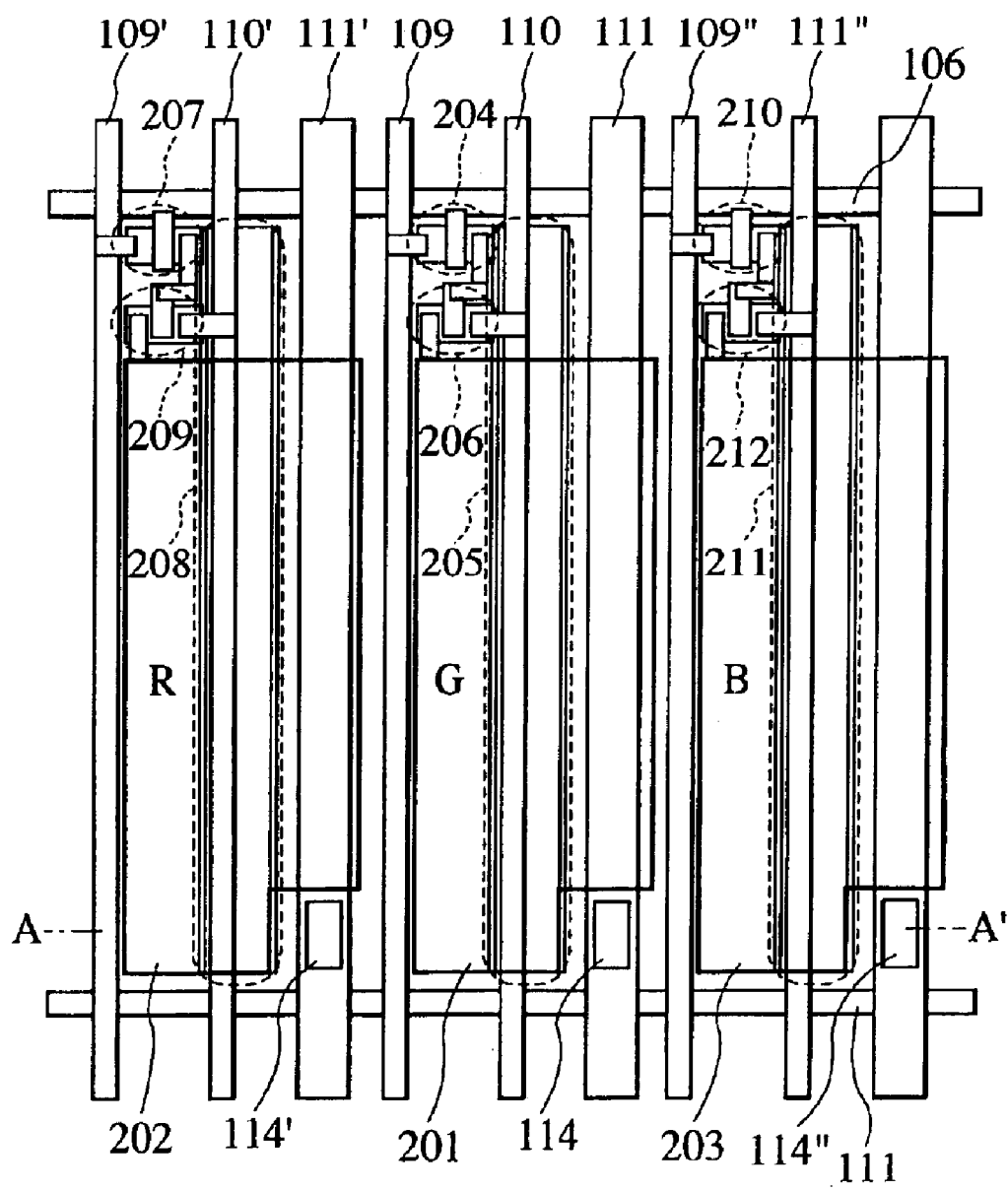
FIG. 12 is a plan view of a pixel region in an organic light-emitting display system according to a sixth embodiment of the present invention.
Figure 13:
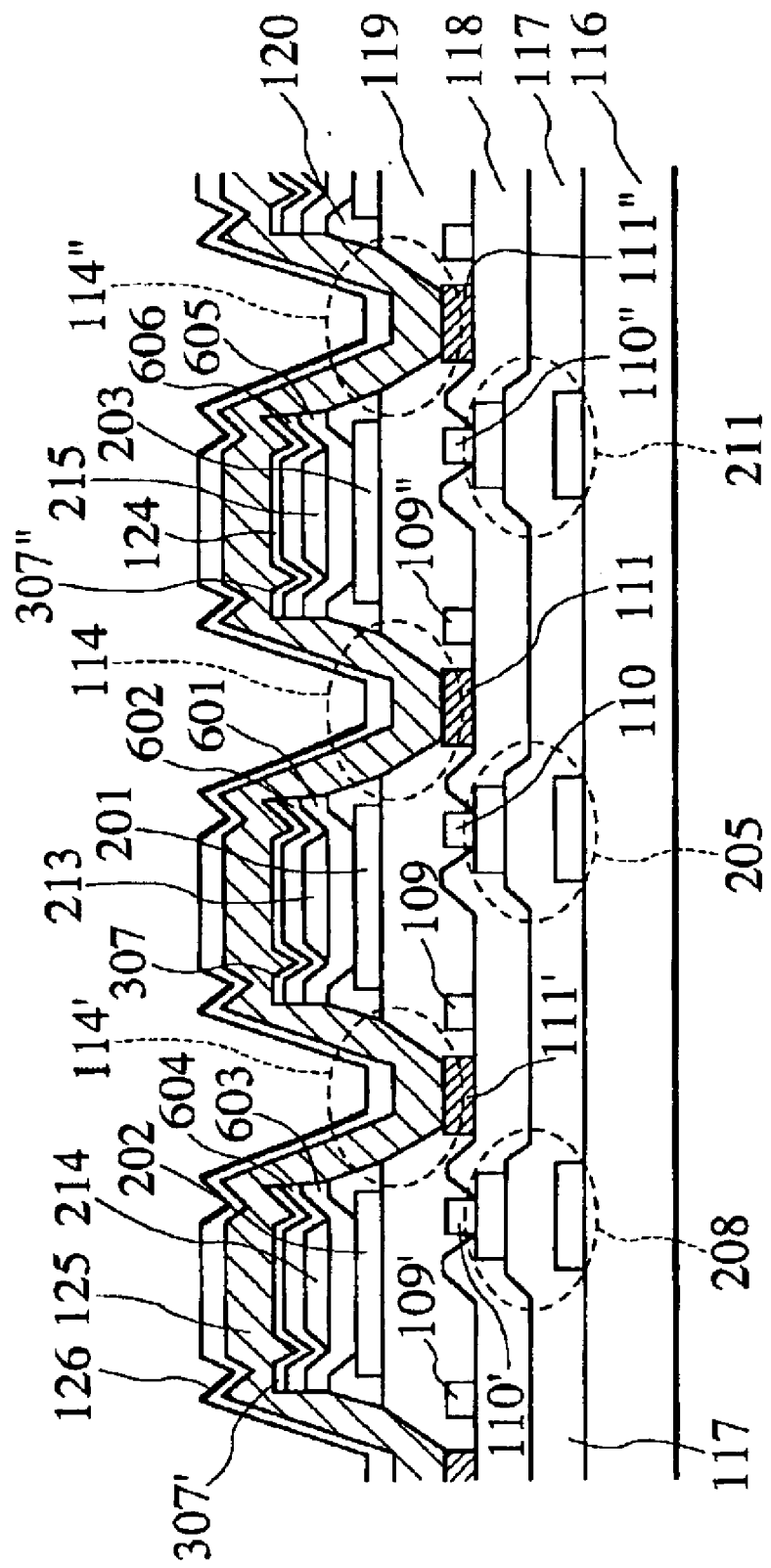
FIG. 13 is a sectional view taken along line A–A' of the pixel region shown in FIG. 12.

A full-color organic light-emitting display device according to a sixth embodiment of the present invention will be described with reference to FIGS. 12 and 13. This display device has feeding points to second current supply lines provided at a plurality of sub-pixels constituting a pixel. FIG. 12 is a plan view of a pixel of the organic light-emitting display system according to this embodiment, and FIG. 13 is a sectional view taken along line A–A' of the pixel region shown in FIG. 12.

In this embodiment, to form feeding points to the second current supply lines 111, 111', 111" for each sub-pixel constituting each pixel of each color picture, the second current supply lines 111, 111', 111" are formed respectively in display regions of red, green and blue pixels, and a second electrode 125 is connected to the second current supply lines 111, 111', 111" through contact holes 114, 114', 114" in the display regions of each sub-pixel, the other constitutions being substantially the same as in the second embodiment.

More particularly, there are formed on a glass substrate 116, a green pixel first transistor 204, a green capacitance 205, a green second transistor 206, a red pixel first transistor 207, a red capacitance 208, a red second transistor 209, a blue pixel first transistor 210, a blue capacitance 211, a blue second transistor 212, signal lines 109, 109', 109", scanning lines 106, 106', first current supply lines 110, 110', 110", second current supply lines 111, 111', 111", a first inter-layer insulation film 118 and a second inter-layer insulation film 119, which are formed by the same methods as in the second embodiment.

Next, contact holes 114, 114', 114" are formed in the first interlayer insulation film 118 and the second interlayer insulation film 119 at upper portions of the second current supply lines 111, 111', 111", respectively, and each of the contact holes 114, 114', 114" is made to be a feeding point.

Subsequently, first electrodes 201, 202, 203 for green, red and blue pixels are formed under the same formation conditions as in the second embodiment. The shapes of the first electrodes 201, 202, 203 are shown in FIG. 12.

Next, a third inter-layer insulation film 120 is formed by the same method as in the second embodiment.

Subsequently, hole transport layers 601, 603, 605 are respectively formed on the first electrodes 201, 202, 203 of the sub-pixels under the same formation conditions as in the second embodiment. The hole transport layers 601, 603, 605 are formed in such a pattern as not to cover the contact holes 114, 114', 114", respectively, the contact holes serving as feeding points.

Next, light-emitting layers 213, 214, 215 are formed on the hole transport layers 601, 603, 605, respectively, by the same method as in the second embodiment.

Subsequently, electron transport layers 602, 604, 605 are formed on the light-emitting layers 213, 214, 215, respectively, by the same method as in the second embodiment.

Next, an Mg—Ag alloy film serving as an electron injection layer 124 is formed on the electron transport layers 602, 604, 605 under the same formation conditions as in the second embodiment. An IZO film serving as a second electrode 125 is formed on the electron injection layer 124 under the same formation conditions as in the second embodiment.

The second electrode 125 is connected to the second current supply lines 111, 111', 111" through the contact holes 114, 114', 114", respectively, which are formed in the first inter-layer insulation film 118 and the second inter-layer insulation film 119. That is, the second electrode 125 of each sub-pixel is connected to the second current supply lines 111, 111', 111" in the display region of each sub-pixel, with the contact holes 114, 114', 114" serving as feeding points.

Subsequently, an SiNx film of 50 nm in thickness is formed by a thermal CVD method. This film functions as a protective layer 126.

According to this embodiment, the second electrode 125 is connected to the second current supply lines 111, 111', 111" in the display regions of the sub-pixels of each pixel, so that variations in wiring resistance due to the resistance of the second electrode 125 of each pixel can be suppressed, and variations in the brightness of the panel can be reduced.

[Embodiment 7]

Figure 14:
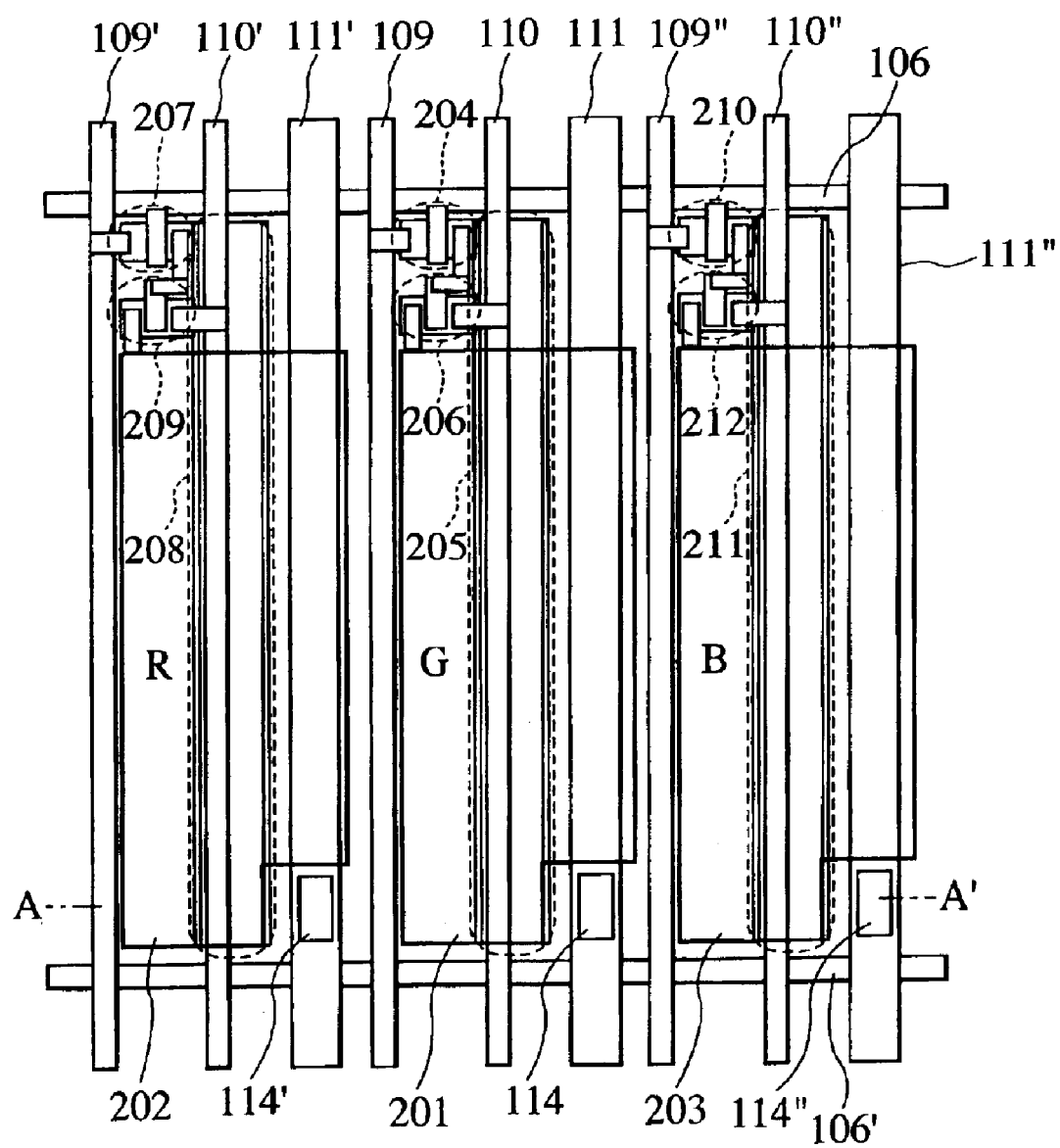
FIG. 14 is a plan view of a pixel region in an organic light-emitting display system according to seventh embodiment of the present invention.
Figure 15:
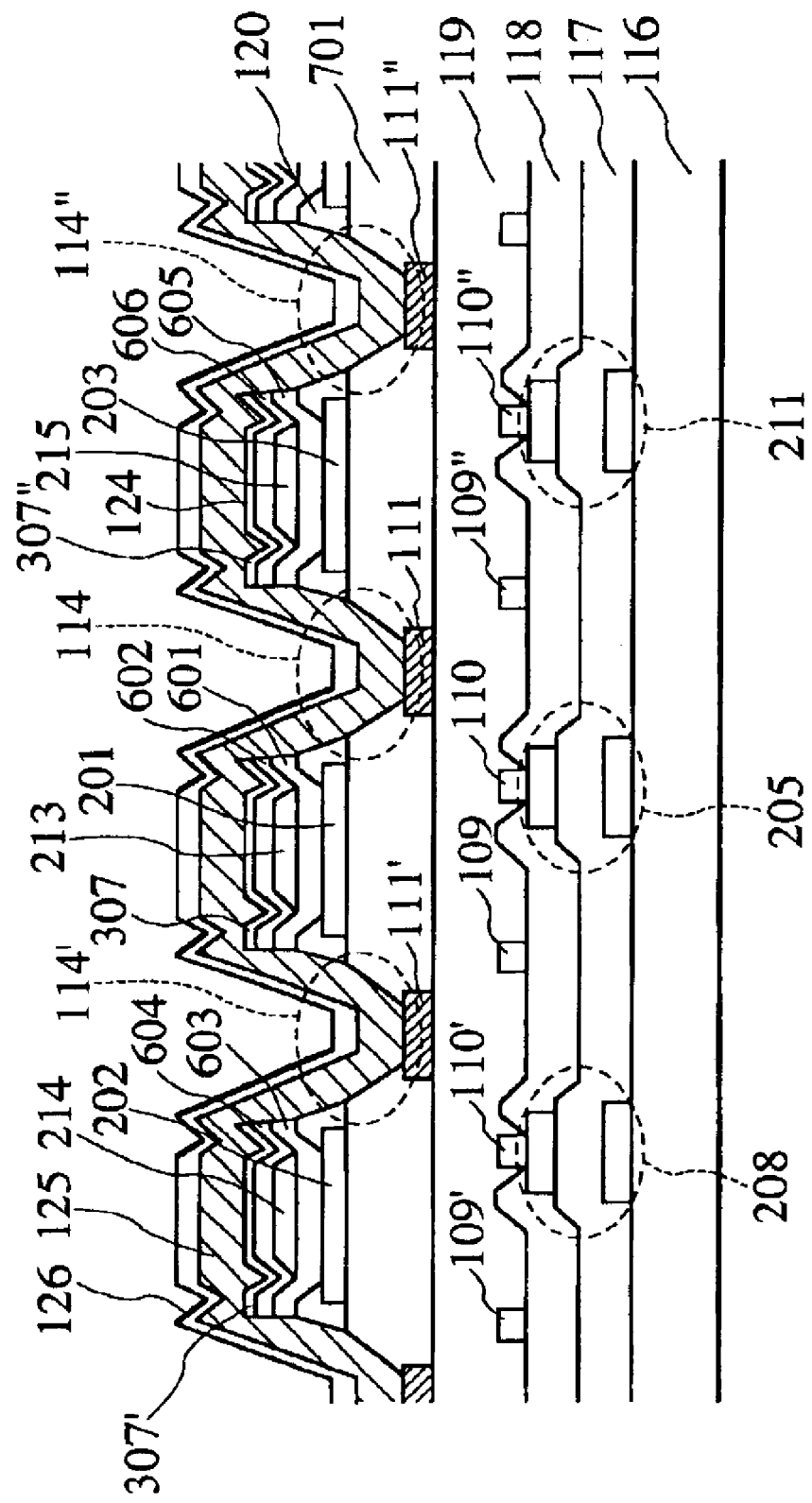
FIG. 15 is a sectional view taken along line A–A' of the pixel region shown in FIG. 14.

A full-color organic light-emitting display system according to a seventh embodiment of the present invention will be described with reference to FIGS. 14 and 15. This display device has a configuration in which a new metallic layer and an interlayer insulation film are provided at a driving layer comprising an organic layer, and a second current supply line is formed of the new metallic layer. FIG. 14 is a plan view of a pixel of the organic light-emitting display system according to this embodiment, and FIG. 15 is a sectional view taken along line A–A' of the pixel region shown in FIG. 14.

In this embodiment, a metallic layer and an interlayer insulation film are provided between a wiring layer comprising signal lines 109, 109', 109" and first current supply lines 110, 110', 110" and a driving layer comprising an organic layer to form second current supply lines 111, 111', 111", the other constitutions being the same as in the sixth embodiment.

More particularly, up to the step of forming a second interlayer insulation film 119 on a glass substrate 116, the processing is the same as in the sixth embodiment, except that the second current supply lines 111, 111', 111" are formed to be a layer other than the wiring layer comprising the signal lines 109, 109', 109" and the first current supply lines 110, 110', 110".

Next, the second current supply lines 111, 111', 111" are formed on the second inter-layer insulation film 119 by the same method as used in the sixth embodiment.

Subsequently, a polyimide coat film serving as a fourth interlayer insulation film 701 is formed on the second current supply lines 111, 111', 111". The polyimide film is formed by use of a self (thin film) non-photosensitive polyimide (code No. PIX-1400), a product of Hitachi Chemical DuPont MicroSystems. The film is formed by a spin coating method, with two-fold dilution using NMP as a solvent. First, the solution is diffused on the entire surface of the substrate at 500 rpm for 10 sec, then a polyimide film is really formed under the conditions of 6000 rpm and 30 sec. Thereafter, the substrate is placed on a hot plate in the atmosphere, and baking is conducted by sequentially changing the baking temperature (baking time) in the sequence of 110° C. (3 min), 190° C. (3 min), 270° C. (3 min) and 350° C. (5 min). The thickness of the polyimide film is 500 nm. The fourth interlayer insulation film 701 is also provided with contact holes 114, 114', 114" as feeding points.

Subsequently, first electrodes 205, 208, 211 for green, red and blue pixels, a third interlayer insulation film 120, hole transport layers 601, 603, 605, light-emitting layers 213, 214, 215, electron transport layers 602, 604, 606, an electron injection layer 124, a second electrode 125, and a protective layer 126 are formed on the fourth interlayer insulation film 701 by the same methods as in the sixth embodiment.

According to this embodiment, the second electrode 125 and the second current supply lines 111, 111', 111" are connected to each other in the display regions of each sub-pixel, with the contact holes 114, 114', 114" serving as feeding points, so that variations in wiring resistance due to the second electrode 125 can be suppressed, and variations in the brightness of the panel can be reduced.

Besides, according to this embodiment, the second current supply lines 111, 111', 111" are formed in a layer different from the layer of the first current supply lines 110, 110', 110", so that it is possible to enlarge the width of the wiring, and a lowering in the resistance of the second current supply lines 111, 111', 111" can be contrived.

[Embodiment 8]

Figure 16:
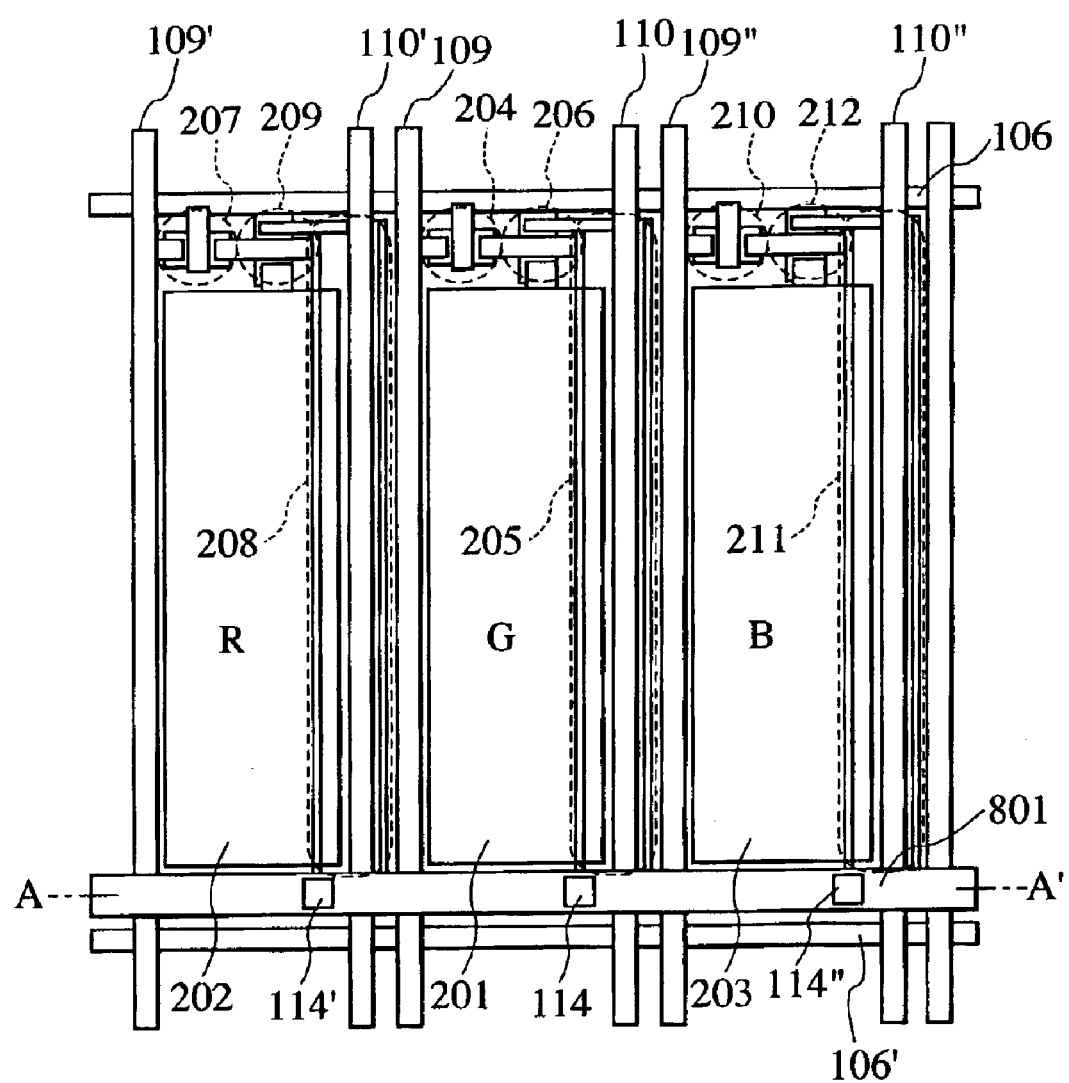
FIG. 16 is a plan view of a pixel region in an organic light-emitting display system according to eighth embodiment of the present invention.
Figure 17:
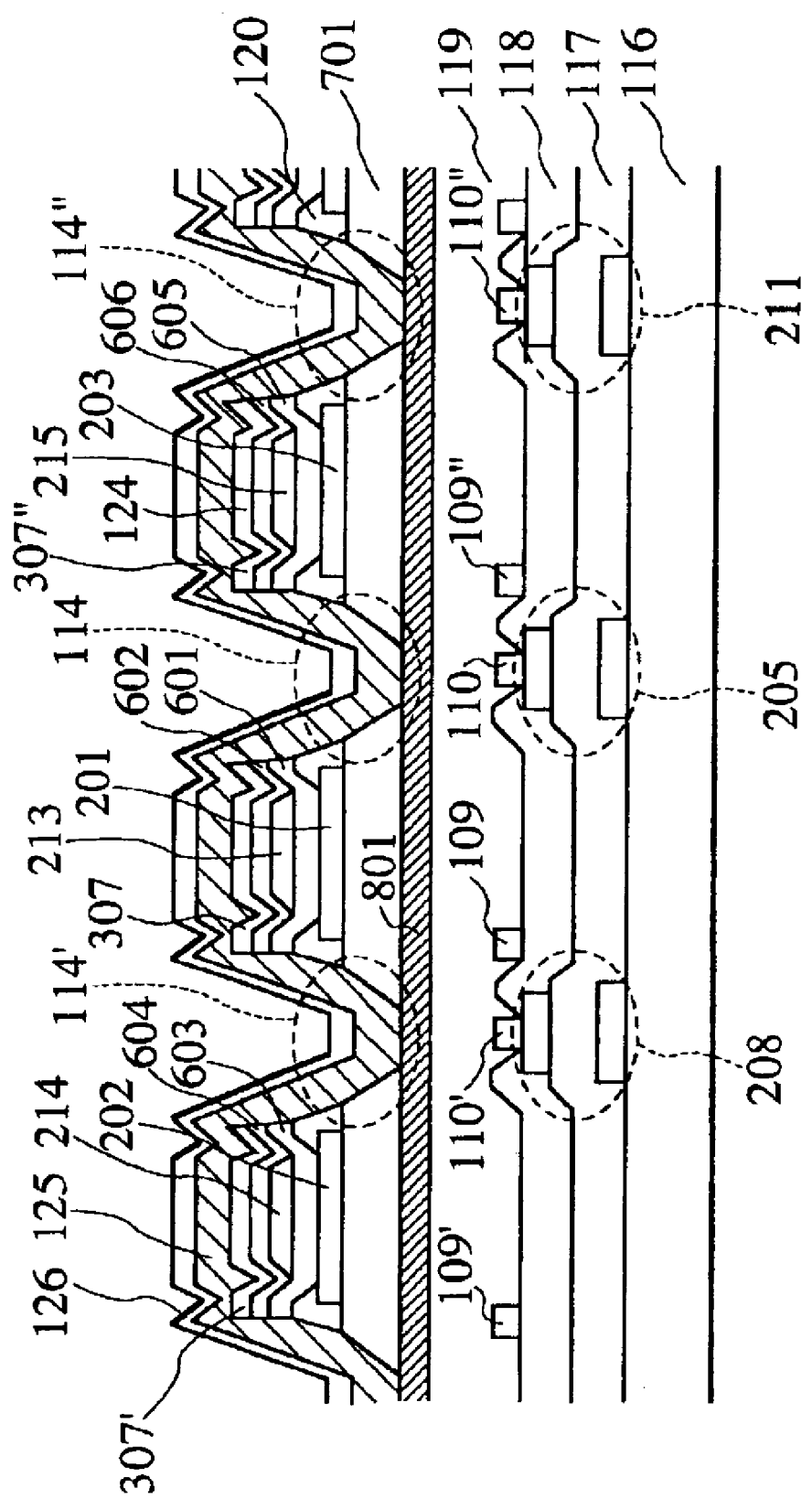
FIG. 17 is a sectional view taken along line A–A' of the pixel region shown in FIG. 16.

A full-color organic light-emitting display device according to an eighth embodiment of the present invention will be described with reference to FIGS. 16 and 17. This display device has a configuration in which a metallic layer and an interlayer insulation film are formed at a driving layer comprising an organic layer and a second current supply line is formed of the metallic layer. FIG. 16 is a plan view of a pixel of the organic light-emitting display device according to this embodiment, and FIG. 17 is a sectional view taken along line A–A' of the pixel region shown in FIG. 16.

In this embodiment, a metallic layer and an interlayer insulation film are formed between a wiring layer comprising signal lines 109, 109', 109" and first current supply lines 110, 110', 110" and a driving layer comprising an organic layer, and a second current supply line is formed of the metallic layer, in the same manner as in the seventh embodiment except that the second current supply line 801 is formed in parallel to the scanning lines 106, 106' in this embodiment, as contrasted to the seventh embodiment in which the second current supply lines 111, 111', 111" are formed in parallel to the signal lines 109, 109', 109", and that the second current supply line 801 is provided with contact holes 114, 114', 114".

More particularly, up to the step of forming a second inter-layer insulation film 119 on a glass substrate 116, the processing is the same as in the seventh embodiment.

Next, the second current supply line 801 is formed on the second interlayer insulation film 119. The second current supply line 801 is formed in parallel to the scanning lines 106, 106' by the same method as in the seventh embodiment. The subsequent steps are the same as in the seventh embodiment.

According to this embodiment, the second electrode 125 is connected to the second current supply line 801 on a sub-pixel basis, with the contact holes 114, 114', 114" serving as feeding points, so that variations in wiring resistance due to the second electrode 125 can be suppressed, and variations in the brightness of the panel can be reduced.

In addition, according to this embodiment, the second current supply line 801 is formed in a layer different from the layer of the first current supply lines 110, 110', 110", so that the wiring width of the second current supply line 801 can be enlarged, and a lowering in the resistance of the second current line 801 can be achieved.

[Embodiment 9]

Figure 18:
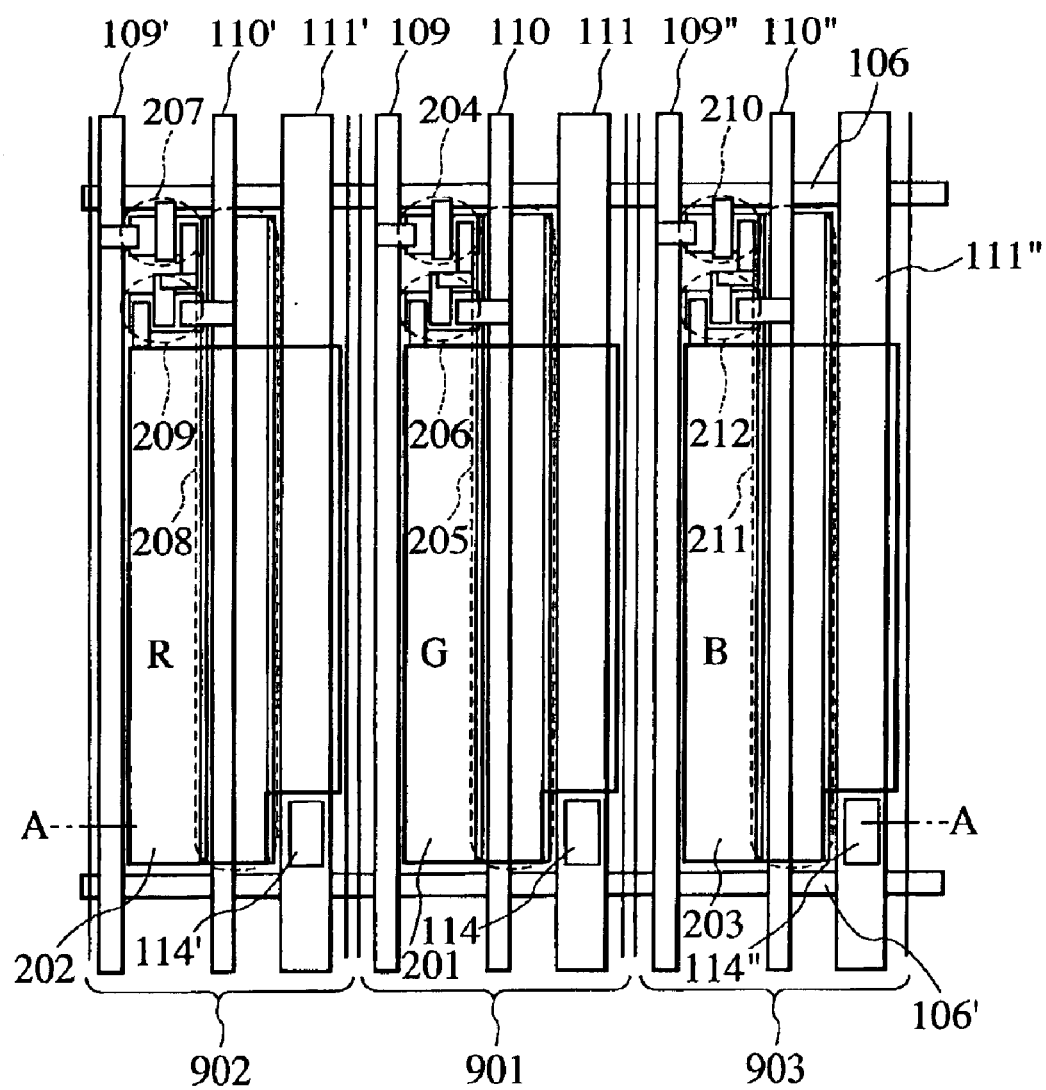
FIG. 18 is a plan view of a pixel region in an organic light-emitting display system according to a ninth embodiment of the present invention.
Figure 19:
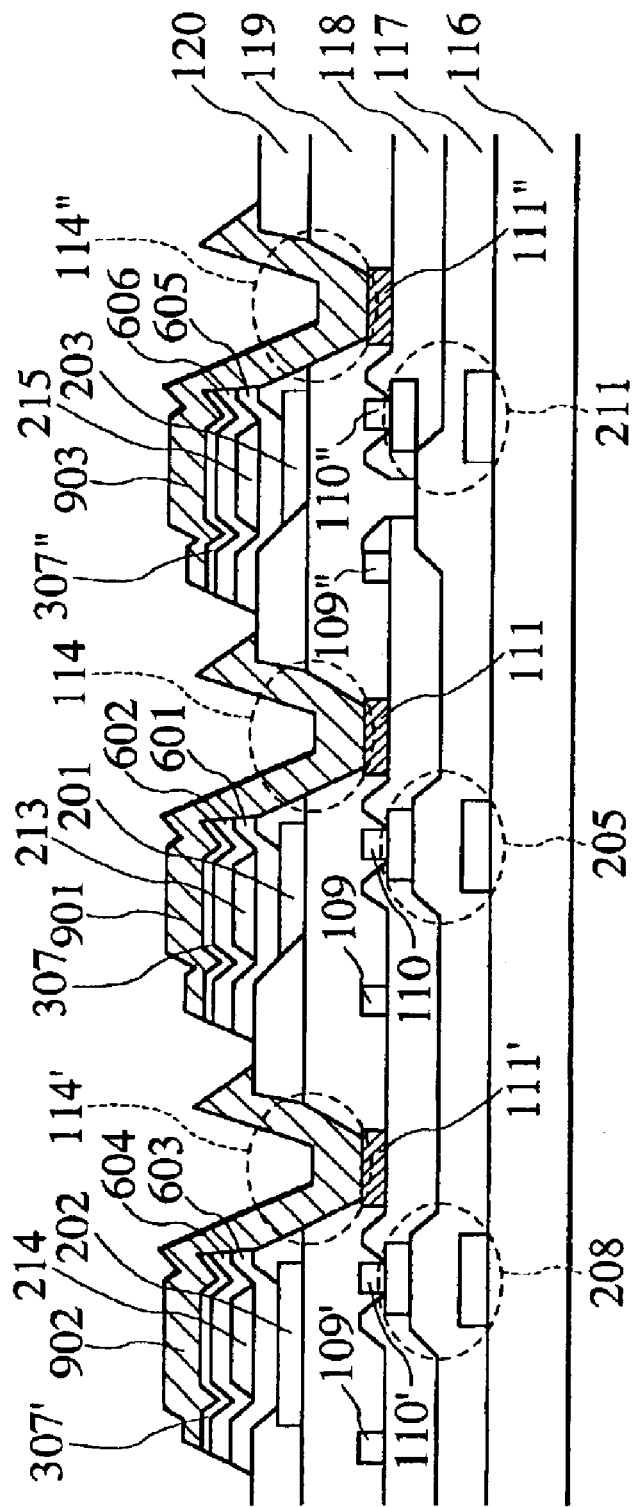
FIG. 19 is a sectional view taken along line A–A' of the pixel region shown in FIG. 18.
Figure 20:
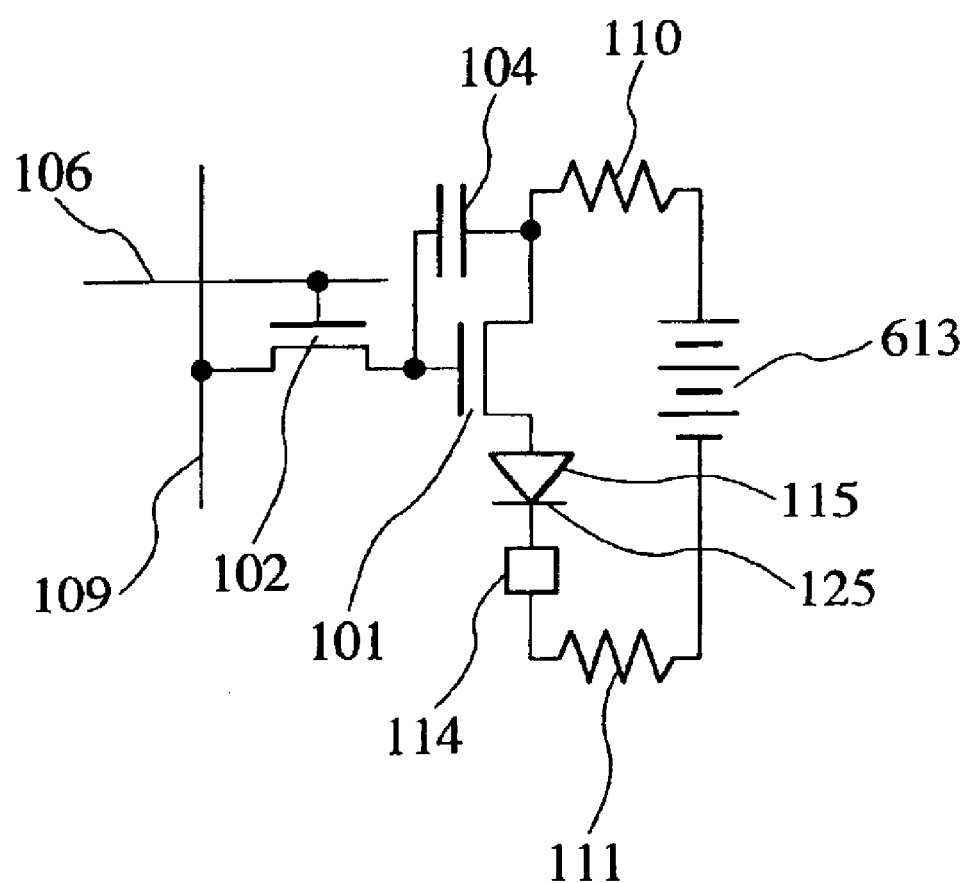
FIG. 20 is an equivalent circuit diagram of a pixel of the organic light-emitting display system according to the first embodiment of the present invention.

A full-color organic light-emitting display device according to a ninth embodiment of the present invention will be described with reference to FIGS. 18 and 19. This display device has a configuration in which second current supply lines for exclusive use for individual sub-pixels are connected to individual color sub-pixels. FIG. 18 is a plan view of a pixel of the organic light-emitting display system according to this embodiment, and FIG. 19 is a sectional view taken along line A–A' of the pixel region shown in FIG. 18.

In this embodiment, second current supply lines 111, 111', 111" parallel to signal lines are formed for each of sub-pixel of each pixel, and second electrodes 901, 902, 903, which are respectively connected to the second current supply lines 111, 111', 111" of the individual sub-pixels, are connected in the display regions of the individual sub-pixels, with contact holes 114, 114', 114" serving as feeding points. In addition, green pixels, red pixels and blue pixels are formed in a stripe pattern with each kind of these pixels arranged in a row, and a sealing substrate 309, which is provided for the purpose of preventing water, oxygen and the like gases in the atmosphere from penetrating into the second electrodes, an organic layer under the second electrodes or the interface between the second electrodes and the organic layer is provided on the upper side of the second electrodes 901, 902, 903. Other constitutions are the same as in the sixth embodiment.

More particularly, the steps from the step of forming the first transistors 204, 207, 210 on a glass substrate 116 up to the step of forming the electron injection layers 307, 307', 307" are the same as in the sixth embodiment, whereby the green pixels, red pixels and blue pixels are formed in a stripe pattern with each kind of the pixels arranged in a row.

The second electrodes 901, 902, 903 in a stripe pattern are formed on the electron injection layers 307, 307', 307" by use of a metal mask under the same conditions as in the sixth embodiment.

Although a metal mask is used for patterning in forming the second electrodes 901, 902, 903, this is not limitative. For example, edge portions of a third interlayer insulation film 120 may be formed in a reverse-tapered shape, and the second electrodes 901, 902, 903 may be formed in a cut-apart state so as to be in a stripe pattern, without using a mask.

Subsequently, sealing is conducted, by use of a sealing substrate 309, in the same manner as in the third embodiment.

According to this embodiment, the second electrodes 901, 902, 903 are respectively connected to the second current supply lines 111, 111', 111" in the display regions of the individual sub-pixels of each pixel, with the contact holes 114, 114', 114" serving as feeding points, so that variations in wiring resistance due to the second electrodes 901, 902, 903 can be suppressed, and variations in the brightness of the panel can be reduced.

In addition, according to this embodiment, the green pixel, red pixel and blue pixel constituting the sub-pixels of each pixel are connected through the second current supply lines 111, 111', 111" for exclusive use, with the contact holes 114, 114', 114" serving as feeding points, so that the voltage or current applied to each sub-pixel can be controlled independently.

According to the present invention, at least the electrode on one side of one organic light-emitting device belonging to each pixel is connected to the current supply line in the display region of each pixel, so that dispersion of luminance due to the resistance of wiring for connecting the electrodes of the organic light-emitting devices and a power source can be reduced, and dispersion of luminance in the display region can be suppressed.

[Embodiment 10]

Figure 21:
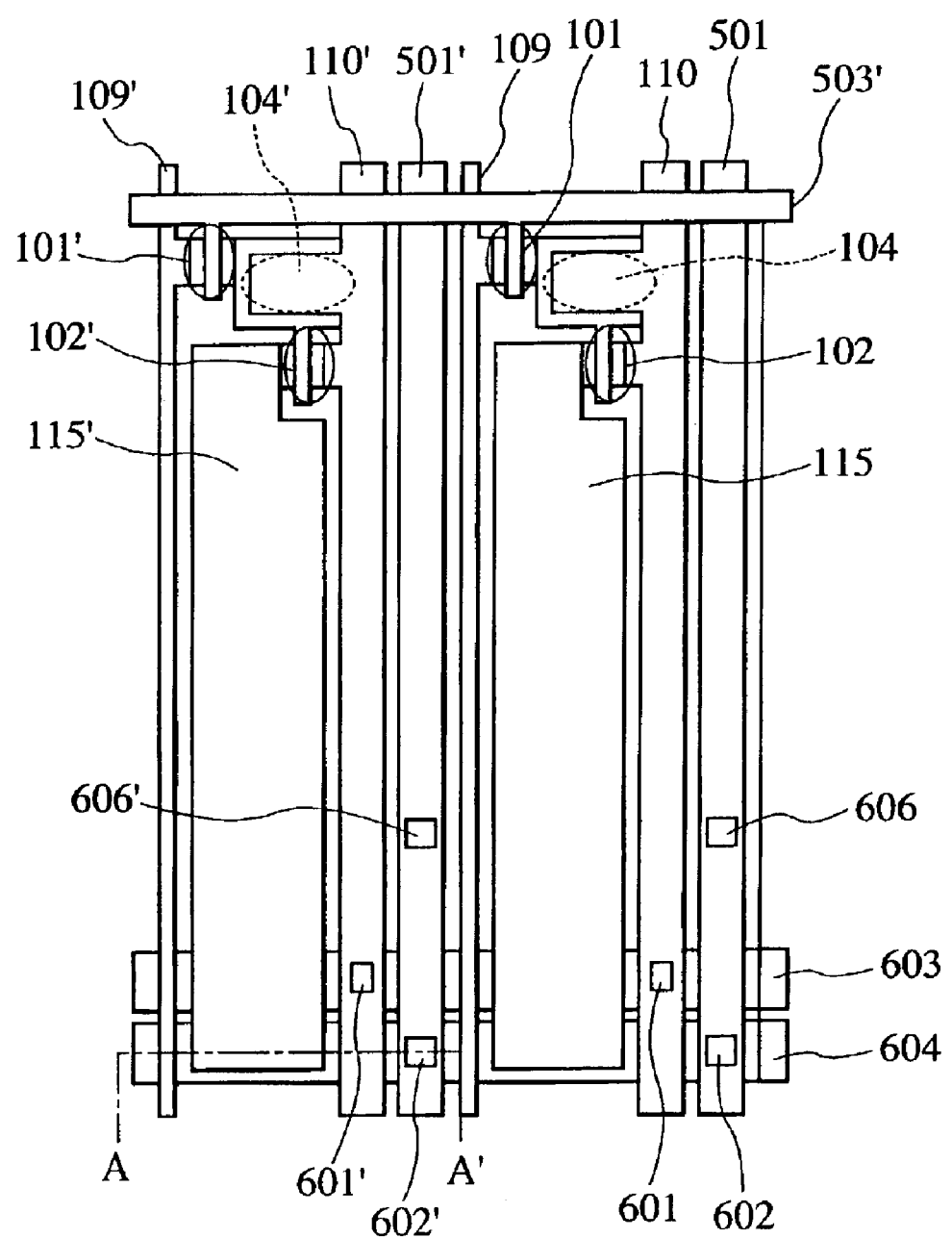
FIG. 21 is a plan view of a pixel region in an organic light-emitting display system according to a tenth embodiment of the present invention.
Figure 22:
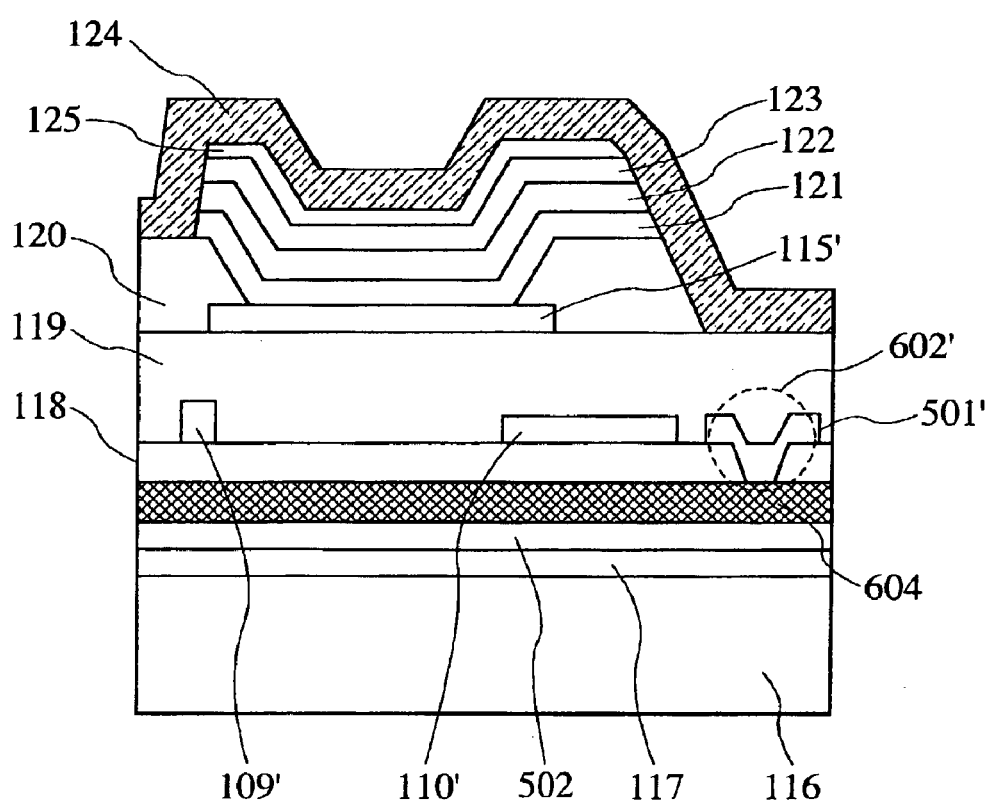
FIG. 22 is a sectional view taken along line A–A' of the pixel region shown in FIG. 21.

Next, a description will be made of a tenth embodiment, in which first current supply lines and second current supply lines are disposed in a mesh form, with reference to FIGS. 21 and 22. FIG. 21 is a plan view of a pixel of an organic light-emitting display system in this embodiment. FIG. 22 is a sectional view of a pixel region taken along line A–A' of FIG. 21. This display system comprises first current supply lines 110', 110 and second current supply lines 501', 501 that are formed in a longitudinal direction in a wiring layer in which signal lines 109, 109' are also formed; and a first current supply line 603 and a second current supply line 604, that are formed in a lateral direction in a wiring layer in which a gate line 503' is also formed. The first longitudinal current supply lines 110' and 110 are connected to the first lateral current supply line 603 at their respective intersections through contact holes 601' and 601, respectively. The second longitudinal current supply lines 501' and 501 are connected to the second lateral current supply line 604 at their respective intersections through contact holes 602' and 602, respectively. Thus, the first and second current supply lines are each formed in a mesh manner. In addition, second electrodes are connected to the second current supply lines 501' and 501 through contact holes 606' and 606, respectively, serving as feeding points. Other portions are configured similarly to those of the fifth embodiment.

With this configuration, since the resistance of the first and second current supply lines can be reduced, variations in the wiring resistance can be suppressed, and, as a result, variations in the brightness of the panel surface can be lowered. In particular, a drop in the voltage of the first current supply line varies the reference voltages of second transistors 102, 102' that determine the display brightness of a pixel, so that a small variation in voltage causes a large variation in current. To suppress the variation in drops in the voltage of the first current supply lines is therefore effective at suppressing the variations in the brightness of the panel surface.

For example, a variation in voltage of 0.5 V in the first current supply lines approximately corresponds to a variation in gate bias voltage of a transistor. Accordingly, an S value of 0.5 V/dec of the transistor causes a variation in the current by as much as ten times. On the other hand, a variation in voltage of 0.5 V in the second current supply lines, which corresponds to a variation in EL drive voltage, affects the brightness. Therefore, when it is assumed that VDS=8 V, a voltage-current characteristic is an exponential function, and an index I is $Ioe^{0.8V}$, a current ratio is 1.5 times and the brightness varies by about 1.5 times. Thus, even small drops in the voltage of 1 V or less in the first current supply line and the second current supply line result in a large variation in the brightness in either case. In particular, the variation in the voltage of the first current supply line results in the greater variations in the brightness. The reduction in the variations of the resistance presented by this embodiment produces the effect of reducing the variations in the brightness.

In addition, the thus configured mesh-like wiring can reduce the variations in voltage between laterally adjacent pixels or sub-pixels, so that smear can be reduced.

The smear occurs in the following manner. As described in the proceeding embodiments, in the case where the first current supply lines are disposed in parallel with the signal lines in a stripe pattern, the current of the first current supply line varies in response to the average brightness of a longitudinally disposed sub-pixel connected to the corresponding first current supply line, and, consequently, a drop in voltage freely varies on a longitudinal line basis. Accordingly, even if patterns with the same brightness are to be displayed at the generally central portion of the panel, a variation in brightness of one of the patterns positioned at the central portion occurs in response to the corresponding displayed pattern that is positioned at the peripheral portion of the panel in each of the longitudinal directions.

Since the lateral current supply lines are connected to the longitudinal current supply lines in this embodiment, the variations in voltage can be reduced in both the longitudinal and lateral directions, thereby preventing the smear from occurring.

[Embodiment 11]

Figure 23:
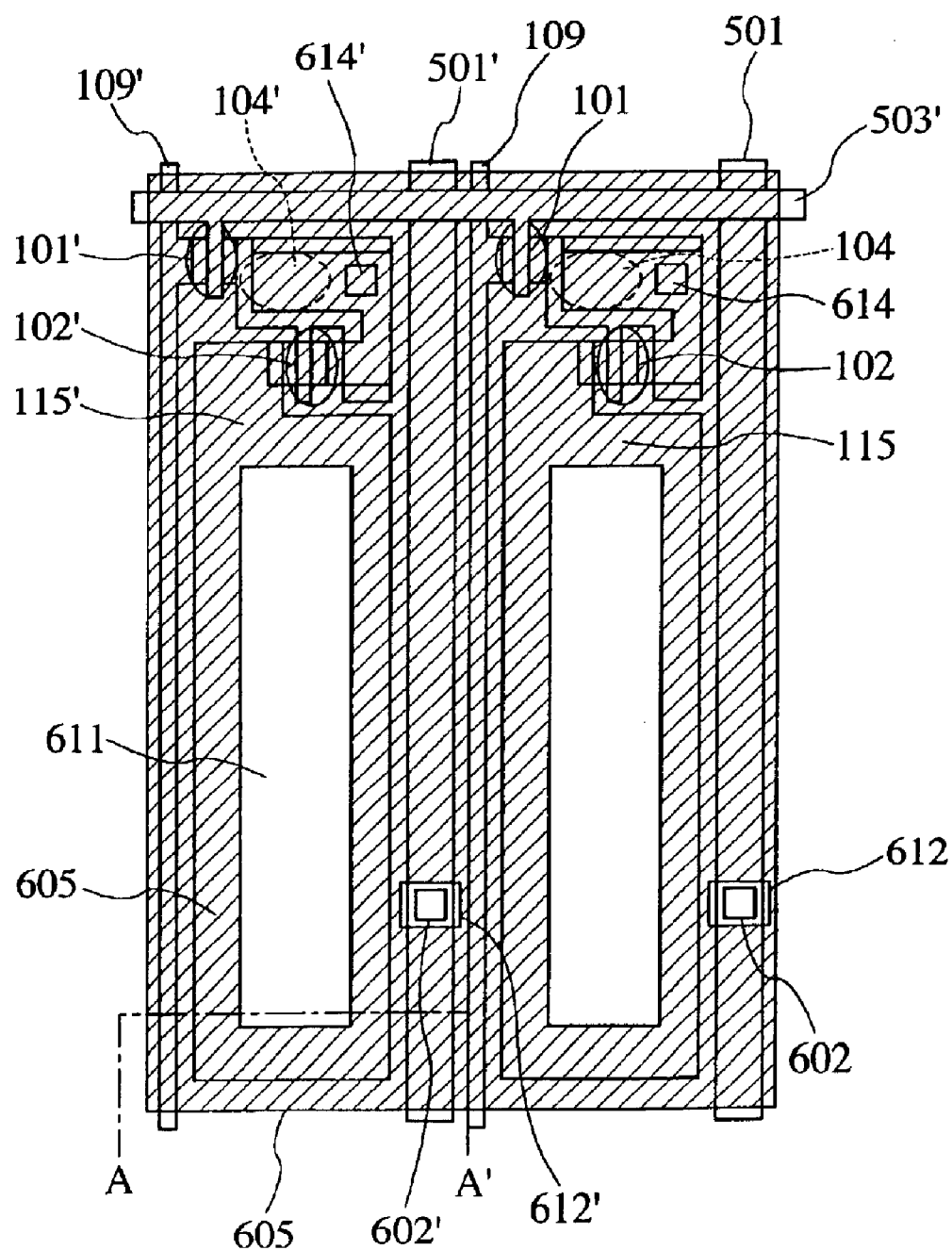
FIG. 23 is a plan view of a pixel region in an organic light-emitting display system according to an eleventh embodiment of the present invention.
Figure 24:
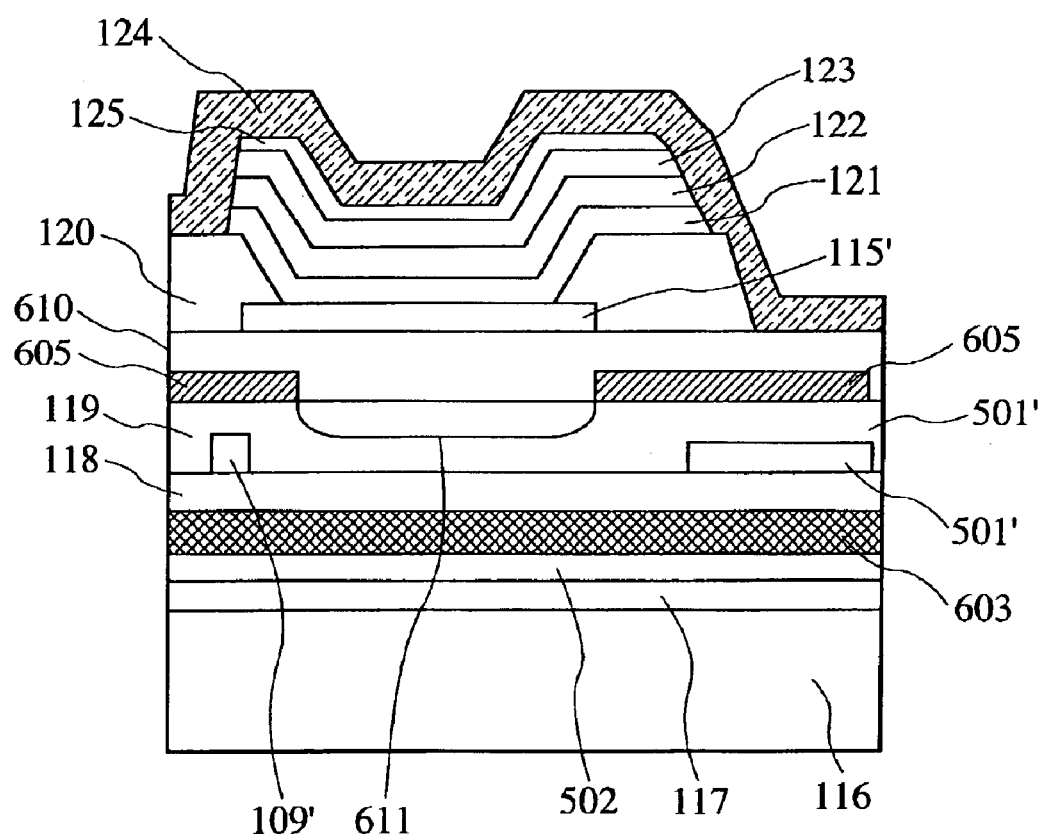
FIG. 24 is a sectional view taken along line A–A' of the pixel region shown in FIG. 23.

An eleventh embodiment will be described with reference to FIGS. 23 and 24. In this embodiment, an aluminum wiring layer with low resistance and an insulating interlayer are additionally provided in a grid form and are used as a first current supply line layer. FIG. 23 is a plan view, and FIG. 24 shows a sectional configuration. The additional aluminum wiring layer 605 and interlayer insulation film 610 are formed by a process similar to that of the third embodiment. A second interlayer film 119 is formed and second current wiring contacts 602, 602' and first current wiring contacts 614, 614' are formed. Thereafter, the aluminum wiring layer 605 and the additional interlayer insulating film 610 are formed and a contact hole 608 is provided. Then, an EL device is formed and a second electrode 125 is formed as an uppermost layer.

Each aluminum wiring layer 605 is provided with an opening 11 for each pixel so as to allow light from the substrate surface to pass therethrough. A second electrode 124 formed in the uppermost layer is connected to second current supply lines 501, 501' through the respective contacts 602, 602' provided below the respective contact openings 612, 612'. On the other hand, the aluminum wiring layer 605 as a first current supply line is connected to second transistors 102, 102' through the first current supply line contacts 614, 614', respectively.

With this configuration, the area of the first current supply line having a large effect on variations in brightness can be remarkably increased to reduce a drop in voltage, so that the variations in brightness can be reduced. In addition, this configuration produces a large effect of reducing smear. This is because the aluminum wiring layers having low resistance are used in a grid form. In particular, an effect of improving the image quality due to the grid-like wiring in an organic EL panel, which is a current drive device, is remarkably larger than that in a liquid crystal display. Also, a liquid crystal display system is provided with wiring which supplies the same potential to each pixel in common. However, since the liquid crystal display is voltage-driven and the device is driven by an electric capacitive load in its operation principle, it is necessary to improve the image quality of the display by matching the selected time for a pixel with the time constant of a transient response of the wiring. For the current drive device, such as an organic EL, since an electric current flows steadily during the period of display after the period of scanning, it is necessary to suppress the variations in brightness of the display by suppressing a drop in the voltage due to the wiring resistance itself. Thus, the current drive device is significantly different from the liquid crystal display in the manner of exhibiting the wiring resistance effect. Since the current wiring layer is made of aluminum having a low resistivity and is formed in a grid form so as to be low-resistant, this embodiment has the advantages of eliminating variations in brightness and smear.

[Twelfth embodiment]

Figure 25:
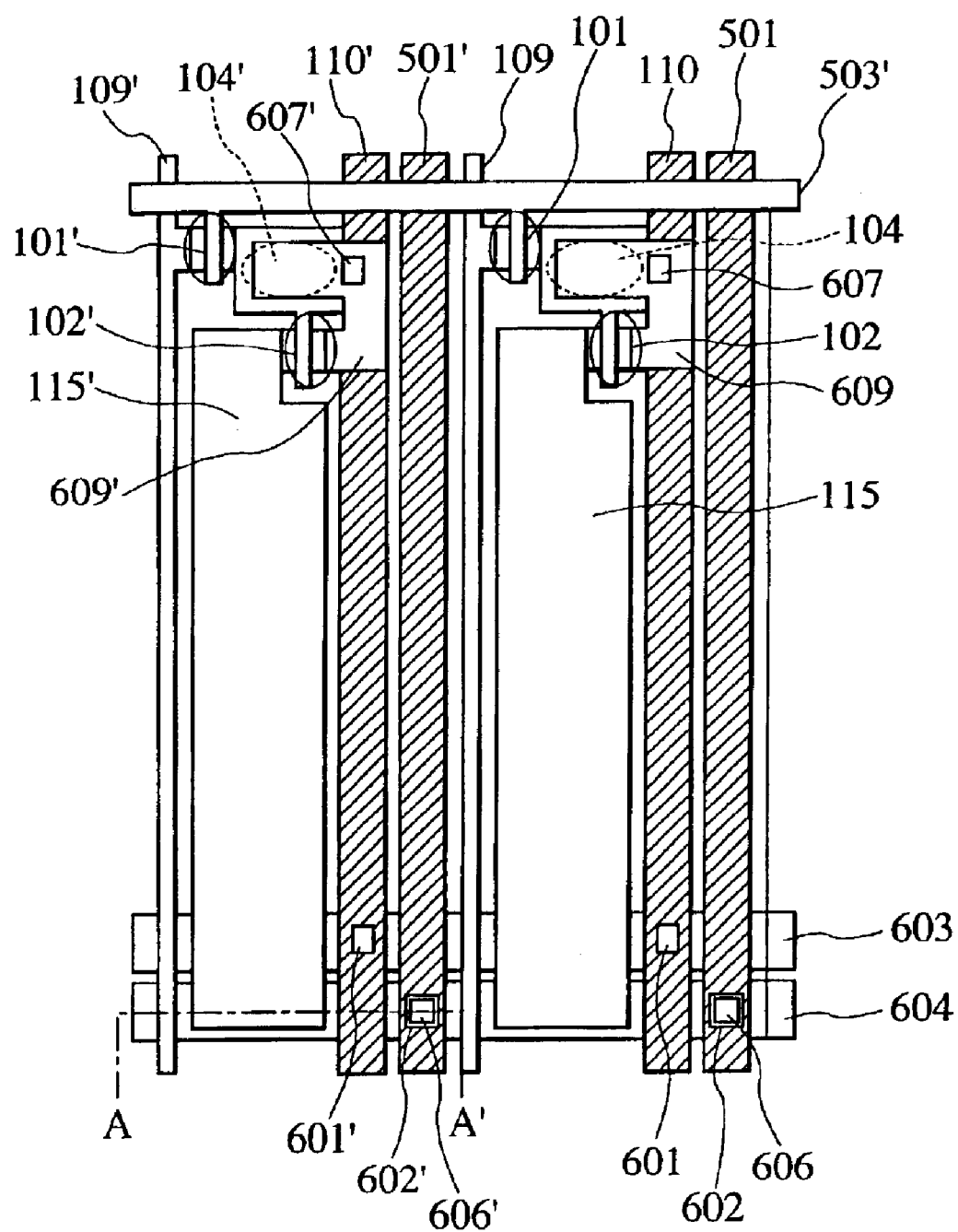
FIG. 25 is a plan view of a pixel region in an organic light-emitting display system according to a twelfth embodiment of the present invention.
Figure 26:
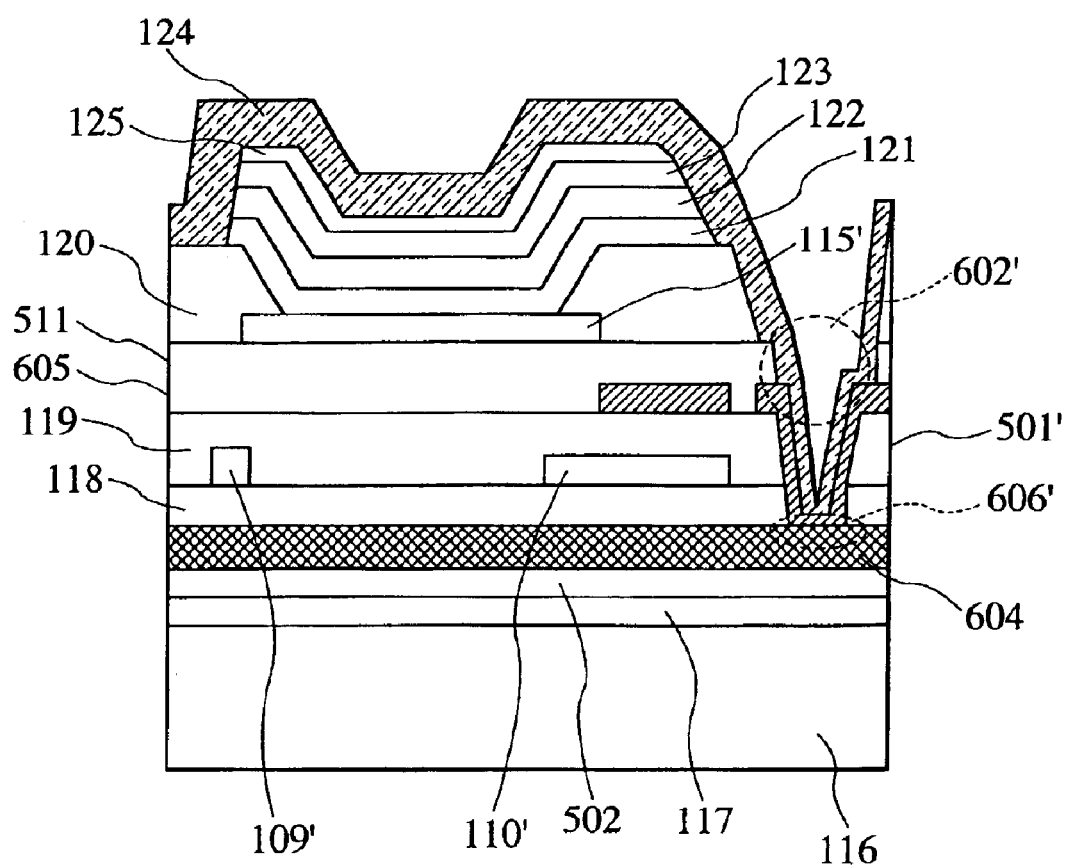
FIG. 26 is a sectional view taken along line A–A' of the pixel region shown in FIG. 25.

A twelfth embodiment will be described with reference to FIGS. 25 and 26. In the present embodiment, first and second longitudinal current supply lines are each disposed in parallel with a signal line, and first and second lateral current supply lines are each disposed in parallel with a scanning line. The first and second longitudinal current supply lines are connected to the first and second lateral current supply lines in a grid form. In particular, for the longitudinal lines disposed parallel to the signal line, an aluminum wiring layer having a low resistance and an interlayer insulation film, which are additionally provided as with the eleventh embodiment, are used. This configuration enlarges the respective widths of the first and second longitudinal lines so as to provide the effects of reducing the resistance thereof and reducing smear.

The manufacturing process of this embodiment is similar to that of the eleventh embodiment. That is, first current supply lines 110, 110' and second current supply lines 501, 501' are formed of aluminum wiring and are disposed in parallel with signal lines 109, 109'. On the other hand, first and second lateral current supply lines 603, 604 are disposed in parallel with a scanning line and are formed in a scanning wiring layer. The first longitudinal current supply lines 110 and 110' are connected to the first lateral current supply line 603 through contact holes 601 and 601', respectively, while the second longitudinal current supply lines 501 and 501' are connected to the second lateral current supply lines 604 through contact holes 602 and 602', respectively. Incidentally, second electrodes 125 are connected to the second current supply lines 501 and 501' through contact holes 606 and 606', respectively, serving as feeding points. In addition, the first current supply line 110 is connected to a second transistor 102 through a connection pattern 609 and a contact hole 607; while, the first current supply line 110' is connected to a second transistor 102' through a connection pattern 609' and a contact hole 607'.

While the invention has been described with reference to preferred embodiments, it is to be understood that the words which have been used are words of description rather than limitation and that changes within the purview of the appended claims may be made without departing from the true scope and spirit of the invention in its broader aspects.

What is claimed is:

1. An organic light-emitting display device comprising:
   a plurality of pixels each of which is a minimum unit of a picture; and
   a plurality of organic light-emitting devices as each said pixel;
   wherein at least an electrode on one side of one organic light-emitting device belonging to each said pixel, of a pair of electrodes disposed on the opposite sides of an organic layer of said plurality of organic light-emitting devices, is connected to a current supply line in a display region of each said pixel, and
   wherein a driving layer comprising a driving device to drive said organic layer is stacked on a substrate, a wiring layer comprising signal lines and scanning lines connected to said driving device is stacked, said organic layer of said plurality of organic light-emitting devices is stacked on said wiring layer on a pixel basis together with the pair of electrodes disposed on the opposite sides of said organic layer, and said current supply line is disposed in said wiring layer and connected to said electrode on one side through an interlayer insulation film.

2. An organic light-emitting display device comprising:
   a plurality of pixels each of which is a minimum unit of a picture; and
   a plurality of organic light-emitting devices as each said pixel;
   wherein an electrode on one side, of a pair of electrodes disposed on the opposite side of an organic layer of said plurality of organic light-emitting devices, is connected to a current supply line in a display region of each said pixel, and
   wherein a driving layer comprising a driving device to drive said organic layer is stacked on a substrate, a wiring layer comprising signal lines and scanning lines connected to said driving device is stacked, said organic layer of said plurality of organic light-emitting devices is stacked on said wiring layer on a pixel basis together with the pair of electrodes disposed on the opposite sides of said organic layer, and said current supply line is disposed in said wiring layer and connected to said electrode on one side through an interlayer insulation film.

3. An organic light-emitting display device comprising:
   a plurality of pixels each of which is a minimum unit of a color picture; and
   a plurality of organic light-emitting devices different in emitted light color as each said pixel;
   wherein at least an electrode on one side of one organic light-emitting device belonging to each said pixel, of a pair of electrodes disposed on the opposite sides of an organic layer of said plurality of organic light-emitting devices, is connected to a current supply line in a display region of each said pixel, and
   wherein a driving layer comprising a driving device to drive said organic layer is stacked on a substrate, a wiring layer comprising signal lines and scanning lines connected to said driving device is stacked, said organic layer of said plurality of organic light-emitting devices is stacked on said wiring layer on a pixel basis together with the pair of electrodes disposed on the opposite sides of said organic layer, and said current supply line is disposed in said wiring layer and connected to said electrode on one side through an interlayer insulation film.

4. An organic light-emitting display device comprising:

a plurality of pixels each of which is a minimum unit of a color picture, and a plurality of organic light-emitting devices different in emitted light color as each said pixel;

wherein an electrode on one side, of a pair of electrodes disposed on the opposite sides of an organic layer of said plurality of organic light-emitting devices, is connected to a current supply line in a display region of each said pixel, and wherein a driving layer comprising a driving device to drive said organic layer is stacked on a substrate, a wiring layer comprising signal lines and scanning lines connected to said driving device is stacked, said organic layer of said plurality of organic light-emitting devices is stacked on said wiring layer on a pixel basis together with the pair of electrodes disposed on the opposite sides of said organic layer, and said current supply line is disposed in said wiring layer and connected to said electrode on one side through an interlayer insulation film.

5. An organic light-emitting display device comprising:

a plurality of pixels each of which is a minimum unit of a color picture; and a plurality of organic light-emitting devices different in emitted light color as each said pixel;

wherein an electrode on one side of said organic light-emitting device of a specified emitted color light of each said pixel, of a pair of electrodes disposed on the opposite sides of an organic layer of said plurality of organic light-emitting devices, is connected to a current supply line in a display region of each said pixel, and, wherein a driving layer comprising a driving device to drive said organic layer is stacked on a substrate, a wiring layer comprising signal lines and scanning lines connected to said driving device is stacked, said organic layer of said plurality of organic light-emitting devices is stacked on said wiring layer on a pixel basis together with the pair of electrodes disposed on the opposite sides of said organic layer, and said current supply line is disposed in said wiring layer and connected to said electrode on one side through an interlayer insulation film.

6. An organic light-emitting display device comprising:

a plurality of pixels each of which is a minimum unit of a picture;

a plurality of organic light-emitting devices as each said pixel; and at least one current supply line disposed in a display region including each said pixel;

wherein at least an electrode on one side of one organic light-emitting device belonging to each said pixel, of a pair of electrodes disposed on the opposite sides of an organic layer of said plurality of organic light-emitting devices, is connected to said current supply line in a display region of each said pixel, and, wherein a driving layer comprising a driving device to drive said organic layer is stacked on a substrate, a wiring layer comprising signal lines and scanning lines connected to said driving device is stacked, said organic layer of said plurality of organic light-emitting devices is stacked on said wiring layer on a pixel basis together with the pair of electrodes disposed on the opposite sides of said organic layer, and said current supply line is disposed in said wiring layer and connected to said electrode on one side through an interlayer insulation film.

7. An organic light-emitting display device as set forth in claim 1, wherein said current supply line is disposed in a layer between said wiring layer and said organic layer.

8. An organic light-emitting display device as set forth in claim 1, wherein an electrode on one side of a pair of electrodes disposed on the opposite side of said organic layer of said plurality of organic light-emitting devices is formed at an upper portion of said organic layer on a substrate as a second electrode, against a first electrode formed at a lower portion of said organic layer on said substrate, and said current supply line is connected to an upper portion of said second electrode.

9. An organic light-emitting display system as set forth in claim 1, wherein an electrode on one side of a pair of electrodes disposed on the opposite sides of said organic layer of said plurality of organic light-emitting devices is formed at an upper portion of said organic layer on said substrate as second electrodes, against a first electrode formed at a lower portion of said organic layer on said substrate, and said current supply line is connected to an upper portion of said second electrode.

10. An organic light-emitting display device as set forth in claim 1, wherein at least two said current supply lines are connected to each other.

11. An organic light-emitting display device as set forth in claim 1, wherein said current supply line is divided into a plurality of current supply lines in correspondence with each said organic light-emitting device of each said pixel, and said plurality of current supply lines thus divided are each connected to each said organic light-emitting device of each said pixel as an exclusive-use current supply line.

12. An organic light-emitting display device as set forth in claim 1, wherein said current supply line is formed along each space between said pixels.

13. An organic light-emitting display device as set forth in claim 1, wherein said current supply line is formed to overlap each said pixel.

14. An organic light-emitting display device as set forth in claim 5, wherein said organic light-emitting device of said specified emitted light color has a higher efficiency or a longer life as compared with said organic light-emitting devices of other emitted light colors.

15. An organic light-emitting display device as set forth in claim 1, wherein an electrode on one side of a pair of electrodes disposed on the opposite sides of said organic layer of said plurality of organic light-emitting devices is formed at an upper portion of said organic layer on a substrate as a second electrode, against a first electrode formed at a lower portion of said organic layer on said substrate, said first electrode is connected to a plus terminal of a power source as an anode, and said second electrode is connected to a minus terminal of said power source as a cathode.

16. An organic light-emitting display device as set forth in claim 15, wherein said second electrode is formed of a transparent material which transmits light there through.

* * * * *